US011803683B2

(12) United States Patent
Yang et al.

(10) Patent No.: US 11,803,683 B2
(45) Date of Patent: Oct. 31, 2023

(54) METHOD OF AND SYSTEM FOR MANUFACTURING SEMICONDUCTOR DEVICE

(71) Applicant: TAIWAN SEMICONDUCTOR MANUFACTURING COMPANY, LTD., Hsinchu (TW)

(72) Inventors: Yao-Jen Yang, Hsinchu (TW); Meng-Sheng Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 8 days.

(21) Appl. No.: 17/342,295

(22) Filed: Jun. 8, 2021

(65) Prior Publication Data

US 2022/0237358 A1 Jul. 28, 2022

Related U.S. Application Data

(60) Provisional application No. 63/142,769, filed on Jan. 28, 2021.

(51) Int. Cl.
*G06F 30/00* (2020.01)
*G06F 30/392* (2020.01)
(Continued)

(52) U.S. Cl.
CPC .......... *G06F 30/392* (2020.01); *G06F 30/398* (2020.01); *H01L 27/0207* (2013.01);
(Continued)

(58) Field of Classification Search
CPC . G06F 30/392; G06F 30/398; H01L 27/0207; H01L 27/11807; H01L 2027/11874; G03F 1/20
See application file for complete search history.

(56) References Cited

U.S. PATENT DOCUMENTS 7,681,164 B2 * 3/2010 Lin .................. G06F 30/392
716/120
7,808,051 B2 * 10/2010 Hou .................. H01L 27/11807
257/E27.06

(Continued)

FOREIGN PATENT DOCUMENTS

EP 2698820 A2 * 2/2014 ......... H01L 27/0207
JP 2013182600 A 12/2013
(Continued)

OTHER PUBLICATIONS

Office Action dated Jul. 28, 2022 for corresponding case No. TW 11120743140. (pp. 1-7).
(Continued)

*Primary Examiner* — Naum Levin
(74) *Attorney, Agent, or Firm* — Hauptman Ham, LLP

(57) ABSTRACT

A method includes receiving a design rule deck including a predetermined set of widths and spacings associated with active regions. The method also includes providing a cell library including cells having respective active regions, wherein widths and spacings of the active regions are selected from the predetermined set of the design rule deck. The method includes placing a first cell and a second cell from the cell library in a design layout. The first cell has a cell height in a first direction, and a first active region having a first width in the first direction. The second cell has the cell height, and a second active region having a second width in the first direction. The second width is different from the first width. The method further includes manufacturing a semiconductor device according to the design layout.

20 Claims, 19 Drawing Sheets

(51) Int. Cl.
  *H01L 27/02*  (2006.01)
  *H01L 27/12*  (2006.01)
  *H01L 27/118*  (2006.01)
  *G06F 30/398*  (2020.01)
  *G03F 1/20*  (2012.01)

(52) U.S. Cl.
  CPC .... *H01L 27/11807* (2013.01); *H01L 27/1222* (2013.01); *G03F 1/20* (2013.01); *H01L 2027/11874* (2013.01)

(56) References Cited

U.S. PATENT DOCUMENTS

| | | | | |
|---|---|---|---|---|
| 9,058,462 | B2* | 6/2015 | Tam | G06F 30/367 |
| 10,262,950 | B1* | 4/2019 | Alston | H01L 21/823487 |
| 11,282,829 | B2* | 3/2022 | Sio | H01L 27/0924 |
| 2005/0280031 | A1 | 12/2005 | Yano | |
| 2011/0049575 | A1 | 3/2011 | Tanaka | |
| 2014/0159180 | A1* | 6/2014 | Sun | H01L 31/107 |
| | | | | 257/431 |
| 2016/0098509 | A1 | 4/2016 | Seo et al. | |
| 2017/0179244 | A1 | 6/2017 | Radens et al. | |
| 2017/0358565 | A1* | 12/2017 | Hensel | H01L 27/11807 |
| 2020/0411530 | A1 | 12/2020 | Wong et al. | |
| 2021/0224458 | A1* | 7/2021 | Guo | G03F 1/70 |
| 2021/0240902 | A1* | 8/2021 | Ku | H01L 51/445 |

FOREIGN PATENT DOCUMENTS

| | | | |
|---|---|---|---|
| KR | 20140110687 A | * | 9/2014 |
| KR | 20160039531 | | 4/2016 |
| KR | 2021002346 | | 1/2021 |
| KR | 20210113552 A | * | 9/2021 |
| TW | 201901966 A | | 1/2019 |
| TW | 201923823 A | | 6/2019 |
| TW | 202001897 A | | 1/2020 |
| TW | 202006948 A | | 2/2020 |

OTHER PUBLICATIONS

Office Action dated Jun. 22, 2022 for corresponding case No. DE 10 2021 115 945.8 (p. 1).

* cited by examiner

Nanosheet width

| W21\W11 | W1 | W2 | W3 | W4 |
|---|---|---|---|---|
| W1 | 0 | $2*(|W1-W2|)$ | $2*(|W1-W3|)$ | $2*(|W1-W4|)$ |
| W2 |  | 0 | $2*(|W2-W3|)$ | $2*(|W1-W4|)$ |
| W3 |  |  | 0 | $2*(|W1-W4|)$ |
| W4 |  |  |  | 0 |

Table (a)

Nanosheet spacing

| S21\S11 | S1 | S2 | S3 | S4 | S5 |
|---|---|---|---|---|---|
| S1 | 0 | $|S1-S2|$ | $|S1-S3|$ | $|S1-S4|$ | $|S1-S5|$ |
| S2 |  | 0 | $|S2-S3|$ | $|S2-S4|$ | $|S2-S5|$ |
| S3 |  |  | 0 | $|S3-S4|$ | $|S3-S5|$ |
| S4 |  |  |  | 0 | $|S4-S5|$ |
| S5 |  |  |  |  | 0 |

Table (b)

Nanosheet width - Example

| W21\W11 | 15 | 22 | 35 | 41 |
|---|---|---|---|---|
| 15 | 0 | 14 | 40 | 52 | — L_a1, L_a2, L_a3 |
| 22 |  | 0 | 26 | 38 | — L_b1 |
| 35 |  |  | 0 | 12 | — L_b2 |
| 41 |  |  |  | 0 | — L_c1 |

Table (c)

Nanosheet spacing - Example

| S21\S11 | 28 | 34 | 36 | 40 | 66 | 80 |
|---|---|---|---|---|---|---|
| 28 | 0 | 6 | 8 | 12 | 38 | 52 | — L_c1, L_b2, L_a3 |
| 34 |  | 0 | 2 | 6 | 32 | 46 |
| 36 |  |  | 0 | 4 | 30 | 44 |
| 40 |  |  |  | 0 | 26 | 40 | — L_b1 |
| 66 |  |  |  |  | 0 | 14 | — L_a2 |
| 80 |  |  |  |  |  | 0 | — L_a1 |

Table (d)

FIG. 3C

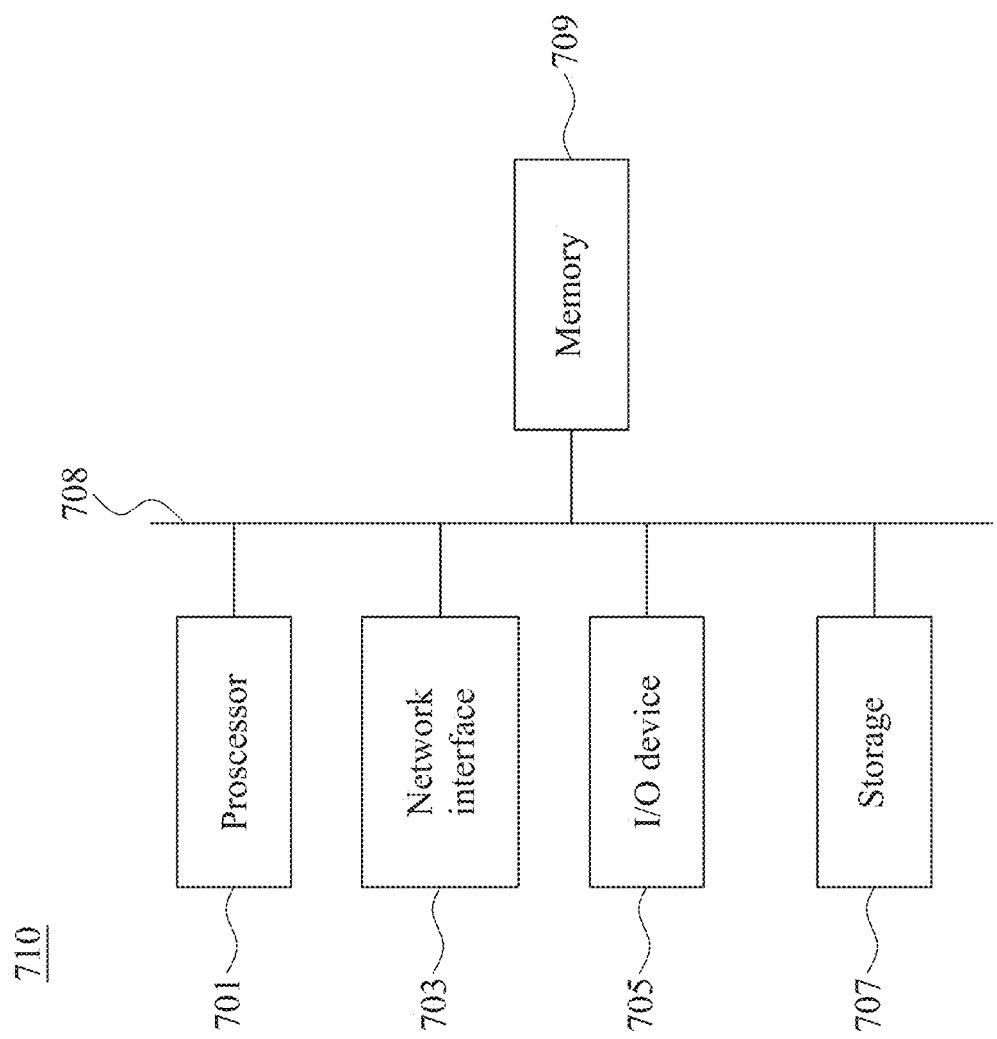

METHOD OF AND SYSTEM FOR MANUFACTURING SEMICONDUCTOR DEVICE

PRIORITY CLAIM AND CROSS-REFERENCE

This application claims priority to U.S. Provisional Application No. 63/142,769 filed Jan. 28, 2021, the disclosure of which is hereby incorporated by reference in its entirety.

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased complexity of processing and manufacturing semiconductor devices. Therefore, there is a continuous need to modify the structure and manufacturing method of the devices in order to improve device robustness as well as reducing manufacturing cost and processing time. Among the various studies of the semiconductor devices, advanced types of field-effect transistors (FET), such as nanosheet FET, have attracted a great deal of attentions for their superior performance, e.g., better gate control and improved short channel effect.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3C includes tables for determining widths and spacings of active regions in various standard cells, in accordance with some embodiments of the present disclosure.

FIG. 7B is a schematic diagram of a design subsystem in the IC manufacturing system shown in FIG. 7A for generating a design layout, in accordance with some embodiments.

DETAILED DESCRIPTION

Figure 1A:
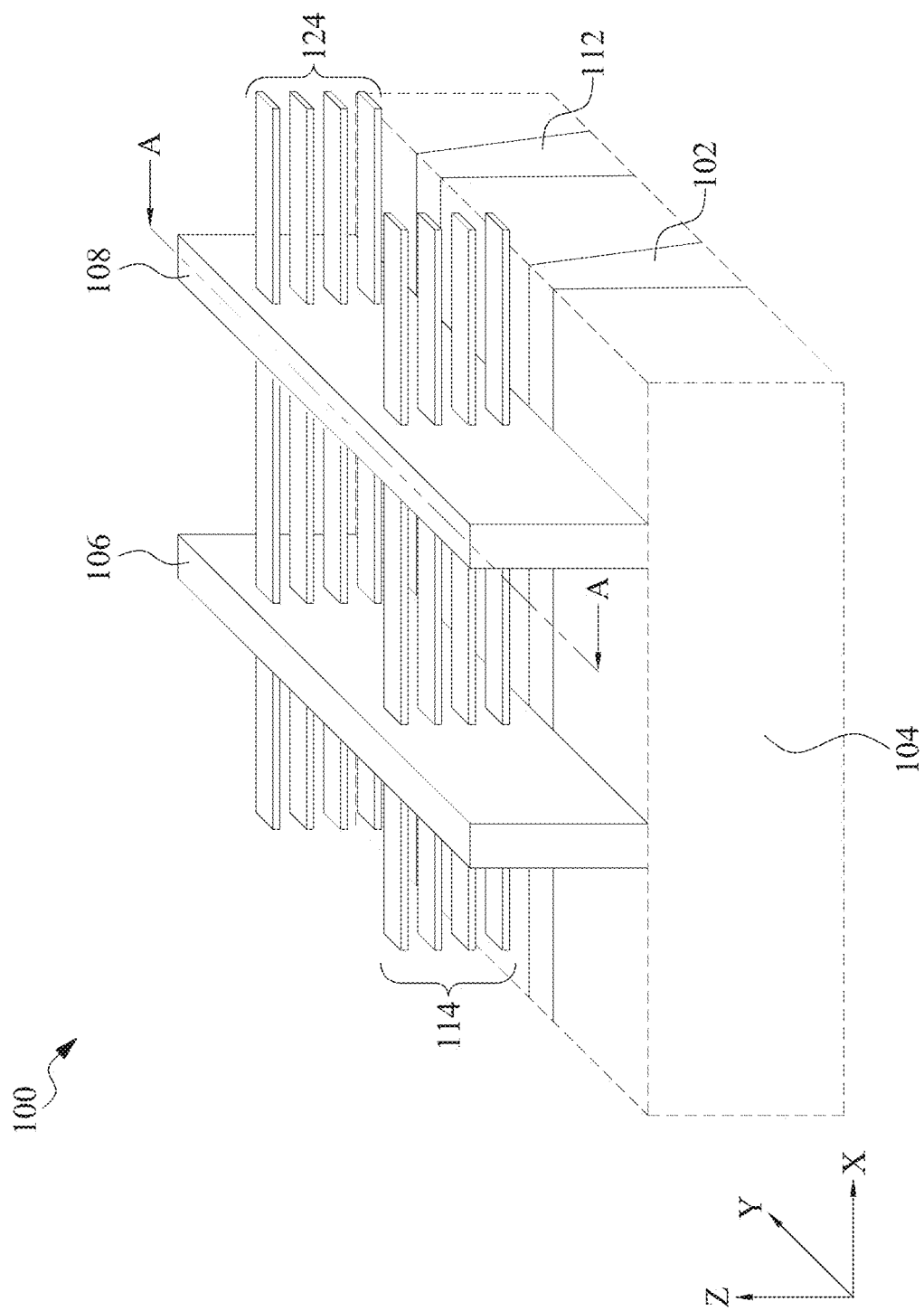
FIG. 1A is a perspective view of a nanosheet field-effect transistor (FET) device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or "cell" used throughout the present disclosure refers to a group of circuit patterns in a design layout to implement specific functionalities of a circuit. A standard cell is comprised of various patterns in one or more layers and may be expressed as unions of polygons. A design layout may be initially constructed through placement of a combination of identical or different standard cells during the layout design stage. The geometries of the patterns in the cells may be adjusted at different stages of layout design in order to compensate for design and process effects. A standard cell may cover circuits corresponding to a portion or an entirety of a die to be manufactured. The standard cells may be accessible from cell libraries provided by semiconductor circuit manufacturers or designers.

Some embodiments of the present disclosure discuss methods of generating standard cells associated with nanosheet field-effect transistor (FET) devices. Due to the fact that the widths and spacings of the nanosheets are irregular discrete numbers, it may involve a great deal of work in a layout revision stage to modify the design layout for fulfilling design rules while maintaining circuit efficiency in area and power. Through the design methodology of the proposed scheme, a set of standard cells associated with nanosheets is generated. In this set, the standard cells are provided with individual nanosheet widths and spacings selected from a finite set of widths and spacings for nanosheets to achieve the goal of equal cell heights among the standard cells, thereby simplifying efforts and cost of modifying the layout of the standard cells in a layout revision stage.

Some embodiments of the present disclosure also discuss layout methods and associated structures of semiconductor devices based on one or more nanosheet field-effect transistor (FET) devices. Through the proposed layout scheme, a semiconductor device is configured to accommodate different types of nanosheet FETs with different device size and capabilities. For example, different standard cells associated with nanosheet FETs can be designed having equal cell heights with different nanosheet sizes and spacings to fulfill design rules of nanosheet dimensions. In this way, the design cycle can be improved in searching for compliant nanosheet sizes and spacings while a better balance between area, power and performance is achieved.

FIG. 1A is a perspective view of a semiconductor device 100, in accordance with some embodiments of the present disclosure. Referring to FIG. 1A, the semiconductor device 100 is a nanosheet FET device. However, other types of semiconductor device are also possible for the semiconductor device 100, such as nanowire FET, fin-type FET, or the like. Referring to FIG. 1A, the semiconductor device 100 includes substrates 102 and 112, an isolation region 104, gate electrodes 106 and 108 and nanosheet stacks 114 and 124.

The substrates 102 and 112 are formed from a same substrate wafer (not shown) and can be seen as two protrusive portions of the substrate wafer. In some embodiments, the substrates 102 and 112 are in a strip shape extending in the x-axis. The substrates 102 and 112 may be formed from a semiconductor substrate, such as a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrates 102 and 112 may include silicon; germanium; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof, or the like.

The isolation region 104 is formed in trenches between the substrates 102 and 112. In some embodiments, the isolation region 104 has an upper surface level with the upper surfaces of the substrates 102 and 112. The isolation regions 114 may include insulating materials, such as a dielectric material, e.g., silicon oxide, silicon nitride, silicon oxynitride, a combination thereof, or the like. The isolation region 114 may be formed by chemical vapor deposition (CVD), high-density plasma CVD (HDP-CVD), flowable CVD (FCVD), atomic layer deposition (ALD), physical vapor deposition (PVD), a combination thereof, or the like. Other insulation materials formed by any suitable process may be also used. In some embodiments, an annealing process may be performed after the insulation material of the isolation region 114 is deposited.

The gate electrodes 106 and 108 are formed over the substrates 102 and 112 and the isolation region 104. The gate electrodes 106 and 108 may extend in a direction, e.g., the y-axis, perpendicular to the direction in which the substrates 102 and 112 extend. In some embodiments, each of the gate electrodes 106 and 108 is made of one or more layers of conductive materials, such as doped polysilicon or metallic materials, e.g., Co, Ru, Al, Ag, Au, W, Ni, Ti, Cu, Mn, Pd, Re, Ir, Pt, Zr, alloys thereof, combinations thereof, or the like, and may further include other work function adjusting metals, diffusion barrier materials or glue layers.

The nanosheet stacks 114 and 124 each includes a plurality of separated nanosheets in a stacked form and is arranged over the substrates 102 and 112 and the isolation region 104. A nanosheet in the nanosheet stack 114 or 124 generally refers to a two-dimensional semiconductor slab with a length or width greater than about 100 nm and a thickness less than about 20 nm. The nanosheet stacks 114 and 124 may extend in a direction, e.g., the x-axis, in which the substrates 102 and 112 extend. In some embodiments, the nanosheet stacks 114 and 124 extend in a direction perpendicular to the direction in which the gate electrodes 106 and 108 extend. The nanosheet stacks 114 and 124 may overlap the gate electrodes 106 and 108. In some embodiments, a portion of each nanosheet of the nanosheet stacks 114 and 124 is surrounded by the gate electrodes 106 and 108.

In some embodiments, the nanosheet stacks 114 and 124 and the substrates 102 and 112 are formed from the same substrate wafer using photolithography and etching operations on this substrate wafer. The nanosheet stack 114 or 124 may be doped with an n-type impurity, e.g., arsenic, phosphorus, or the like, to form an n-type nanosheet FET, or may be doped with a p-type impurity, e.g., boron or the like, to form a p-type nanosheet FET. The stacked nanosheets of a same nanosheet stack 114 or 124 are configured to form a combined channel region or a combined source/drain region of a nanosheet FET. For example, the portion of each nanosheet of the nanosheet stack 114 which overlaps the gate electrode 106 serves as a combined channel region of a first nanosheet FET, while the other portions of each nanosheet of the nanosheet stack 114 on two sides of the channel region serves as the source/drain regions of the first nanosheet FET. Similarly, the portion of each nanosheet of the nanosheet stack 124 which overlaps the gate electrode 106 serves as a combined channel region of a second nanosheet FET, while the other portions of each nanosheet of the nanosheet stack 124 on two sides of the channel region of the second nanosheet FET serves as the source/drain regions of the second nanosheet FET.

In the depicted example, the number of nanosheet stacks 114, 124 is set as two. However, the present disclosure is not limited thereto, and the number of the nanosheet stacks of the semiconductor device 100 can be less than or more than two. In the depicted example, each of the nanosheet stacks 114 and 124 has four nanosheet stacked over another. However, the present disclosure is not limited thereto, and the nanosheet stacks 114 and 124 can have an arbitrary number of nanosheets. In the depicted example, the number of gate electrodes is two. However, the present disclosure is not limited thereto, and the number of the gate electrodes of the semiconductor device 100 can be less than or more than two.

In some embodiments, the nanosheets in a same stack 114 or 124 are formed to have substantially equal dimensions, such as the nanosheet length measured in the x-axis, the nanosheet width measured in the y-axis and the nanosheet thickness measured in the z-axis. In some embodiments, the nanosheet dimensions of one nanosheet stack, e.g., the nanosheet stack 114, may be different to those of another nanosheet stack, e.g., the nanosheet stack 124. In some embodiments, the nanosheet stacks 114 and 124 have substantially equal nanosheet thicknesses and different nanosheet widths or nanosheet lengths.

Figure 1B:
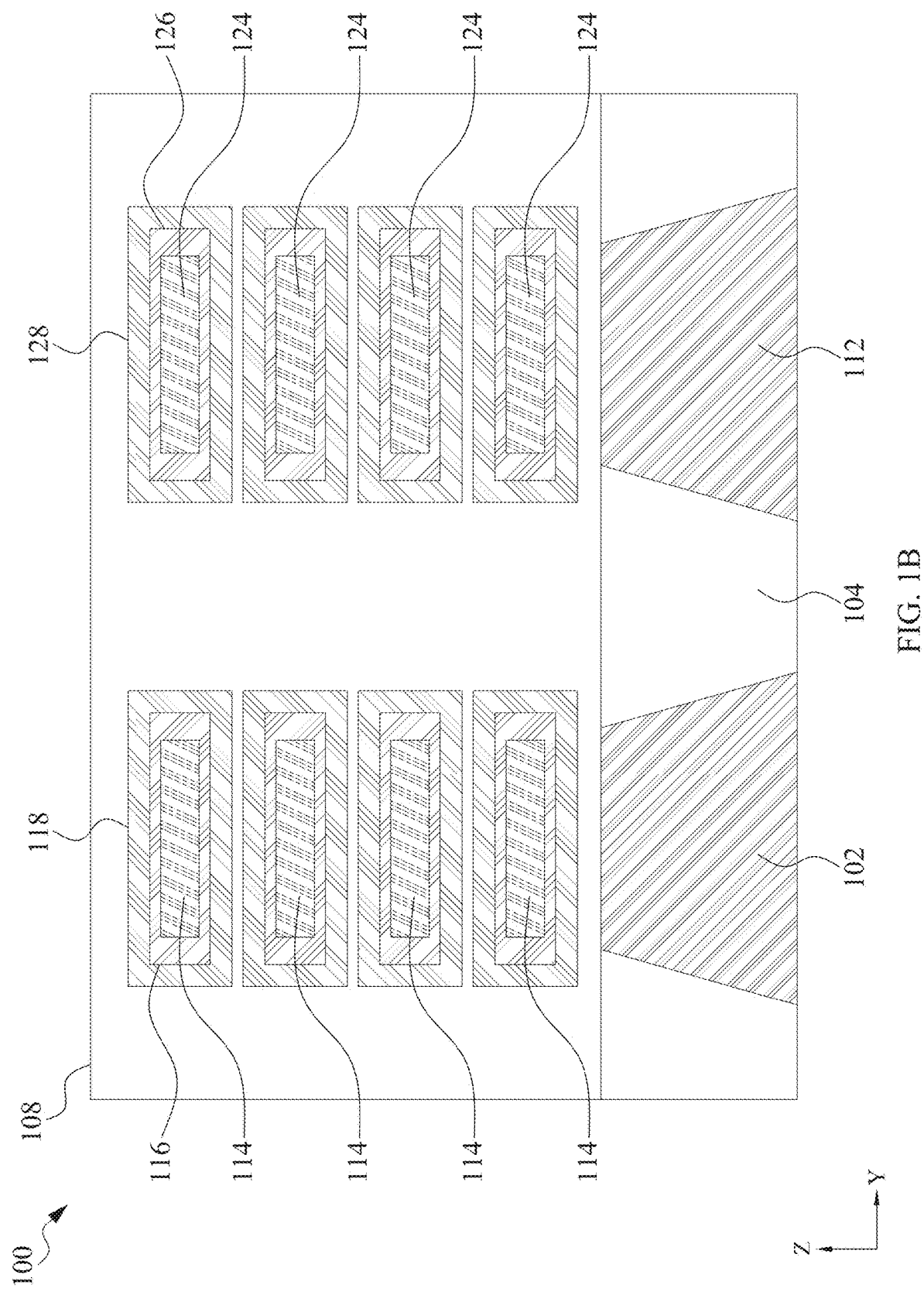
FIG. 1B is a cross-sectional view of the nanosheet FET device shown in FIG. 1A, in accordance with some embodiments of the present disclosure.

FIG. 1B is a cross-sectional view of the nanosheet FET 100 shown in FIG. 1A, in accordance with some embodiments of the present disclosure. The cross-sectional view of FIG. 1B is taken along the sectional line AA cutting through the gate electrode 108 of FIG. 1A. Referring to FIG. 1A and FIG. 1B, the nanosheet FET device 100 further includes a gate insulating layer 116 or 126 between the gate electrode 108 and each nanosheet of the nanosheet stack 114, 124. The gate insulating layer 116 or 126 may be formed of one or more dielectric materials, such as oxide, nitride, oxynitride, or high-k dielectric materials, such as $Al_2O_3$, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$ (BTO), $SrTiO_3$ (STO), $BaSrTiO_3$ (BST), $PbZrO_3$, lead-strontium-titanate (PST), lead-zinc-niobate (PZN), lead-zirconate-titanate (PZT), lead-magnesium-niobium (PMN), yttria-stabilized zirconia (YSZ), ZnO/Ag/ZnO (ZAZ), a combination thereof, or the like.

In some embodiments, the nanosheet FET 100 further includes a work function adjusting layer 118, 128 between the gate electrode 108 and each of the gate insulating layer 116, 126. In embodiments of an n-type nanosheet FET 100, the work function adjusting layer 118, 128 is formed of Ti, Ag, Al, TiAl, TiAlN, TiAlC, TaC, TaCN, TaSiN, TaAlC, Mn, Zr, a combination thereof, or the like, and may be formed to wrap around the gate insulating layer 116, 126 by a deposition method such as atomic layer deposition (ALD), chemical vapor deposition (CVD), physical vapor deposition (PVD), combinations thereof, or the like. In embodiments of a p-type nanosheet FET 100, the work function adjusting layer 118, 128 is formed of TiN, WN, TaN, Ru, Co, a combination thereof, or the like, and may be formed to wrap around the gate insulating layer 116, 126 by ALD, CVD, PVD, combinations thereof, or the like.

Figure 2:
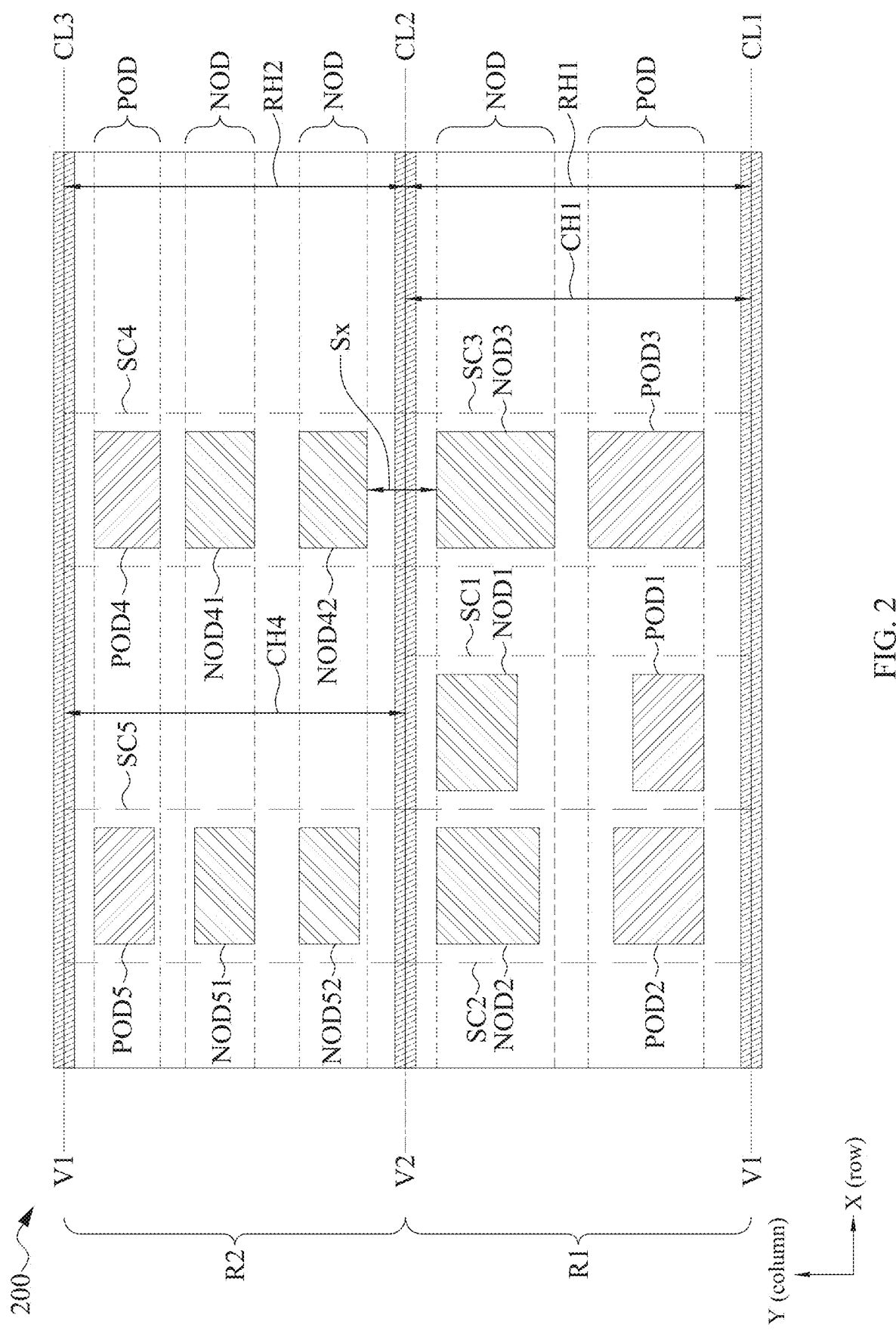
FIG. 2 is a schematic diagram of a design layout, in accordance with some embodiments of the present disclosure.

FIG. 2 is a schematic diagram 200 of a design layout, in accordance with some embodiments of the present disclosure. The design layout 200 may include at least one semiconductor device, e.g., a complementary metal-oxide-semiconductor (CMOS) device, and can be implemented using a FET device, e.g., the nanosheet FET 100 as shown in FIG. 1A. In some other embodiments, the design layout 200 includes a gate-all-around (GAA) device, a nanowire device, or the like.

The design layout 200 includes two exemplary rows R1 and R2 extending in a row direction along the x-axis. In the depicted example, only two rows are arranged in a column direction along the y-axis (perpendicular to the row direction) in the design layout 200. However, the disclosure is not limited thereto and more than two rows are possible. The design layout 200 further includes first power rails V1 and second power rails V2 are alternatingly arranged and extend in the row direction (only one second power rail V2 is illustrated in FIG. 2 for brevity). Each of the first power rails V1 and the second power rail V2 is arranged on an upper side or lower side of one of the rows R1, R2. In some embodiments, the center line of each of the first power rails V1 and the second power rails V2 is aligned with the upper side or lower side of the row R1 or R2. In some embodiments, the first power rails V1 are configured to supply first voltage while the second power rails V2 are configured to supply second voltage different from the first voltage. In some embodiments, the first voltage is VDD and the second voltage is ground, or vice versa.

Referring to FIG. 2, the design layout 200 includes a plurality of standard cells, for example, standard cells SC1, SC2, SC3, SC4 and SC5. The standard cells SC1, SC2 and SC3 may be predetermined and stored in a cell library and accessible by a circuit designer. During a placement operation, the standard cells SC1, SC2 and SC3 are arranged in the row R1 and the standard cells SC4 and SC5 are arranged in the row R2. Although FIG. 2 shows only two or three standard cells in one row, the number of standard cells arranged in one row may be greater than three. Further, in some embodiments some of the standard cells contact each other, e.g., the standard cells SC1 and SC2; in some other embodiments, the standard cells are separate from each other, e.g., the standard cells SC4 and SC5.

The dimensions of the standard cells SC1 through SC5 are defined by their respective cell boundaries, in which each cell boundary includes an upper cell side and a lower cell side (both extending in the row direction) and a left cell side and a right cell side (both extending in the column direction). The standard cells SC1 through SC5 may be separated from one another or share at least one cell side. In some embodiments, the standard cells SC1 through SC5 have respective upper cell sides and lower cell sides aligned with the center lines of either the first power rails V1 or the second power rails V2. Each standard cell SC1 through SC5 may have the same or different cell lengths in the row direction.

In some embodiments, a row height RH1 of the first row R1 is defined as a distance in the column direction between a center line CL1, extending in the row direction, of the lower first power rail V1 and the center line CL2, extending in the row direction, of the second power rail V2. In some embodiments, a cell height CH1 is determined based on a pitch between the lower first power rail V1 and the second power rail V2. Similarly, a row height RH2 of the second row R2 is defined as a distance in the column direction between a center line CL2 and a center line CL3 of the upper first power rail V1. In some embodiments, the row height RH2 is determined based on a pitch between the second power rail V2 and the upper first power rail V1. In some embodiments, the row height RH1 is the same as or different from the row height RH2.

In some embodiments, the cell height CH1 of the standard cell SC1, SC2 or SC3 is determined based on the row height RH1. In some embodiments, the cell height CH1 is determined based on a pitch between the lower first power rail V1 and the second power rail V2. In some embodiments, the cell height CH1 is equal to the row height RH1. Similarly, the cell height CH4 of the standard cell SC4 or SC5 is equal to the row height RH2.

Each of the rows R1 and R2 defines one or more (row) active regions NOD and POD (indicated by dashed line boxes) along the row direction, in which the active regions POD and NOD have opposite conductivities. For example, the active region NOD denotes an active region doped with n-type dopants while the active region POD denotes an active region doped with p-type dopants. Each of the standard cells SC1 through SC5 includes one or more (cell) active regions (indicated by solid line boxes) with the dimensions defined by the cell boundaries of the respective standard cells and the boundaries of the respective (row) active region NOD or POD. For example, the standard cell SC1 includes an n-type active region NOD1 and a p-type cell active region POD1, where the n-type active region NOD1 is defined by the cell boundary of the standard cell SC1 and the boundary of the row active region NOD in the row R1, while the p-type active region POD1 is defined by the cell boundary of the standard cell SC1 and the boundary of the row active region POD in the row R1. The (cell) active region NODxy or PODxy (x denotes the index of the standard cell, and y is optionally used to denote the ordinal number to distinguish more than one similar active regions) within each standard cell SC1 through SC5, e.g., the active regions NOD1 and POD1, illustrated in the design layout 200 correspond to a top view of a nanosheet stack, e.g., nanosheet stack 114 or 124, of the semiconductor device in the respective standard cell SC1 through SC5. As a result, the configurations of the aforesaid (cell) active regions will determine the planar dimensions of the nanosheets in the nanosheet FET of the respective standard cell SC1 through SC5.

Referring to FIG. 2, the standard cells SC1, SC2, SC3 include respective n-type active regions NOD1, NOD2, NOD3 that are overlapped with each other in the row direction within the row active region NOD. In some embodiments, the active regions NOD1, NOD2 and NOD3 have different active region widths, referred to as OD (oxide definition) widths herein, measured in the column direction. In some embodiments, although the widths of the active regions NOD1, NOD2 and NOD3 are different, each of these active regions has at least one side, e.g., an upper side, aligned with one side of other active regions.

Similarly, the standard cells SC1, SC2, SC3 include respective n-type active regions POD1, POD2, POD3 overlapped with each other in the row direction within the row active region POD. In some embodiments, the active regions POD1, POD2 and POD3 have different OD widths. In some embodiments, although the widths of the active regions POD1, POD2 and POD3 are different, each of these active regions has at least one side, e.g., a lower side, aligned with a side of other active regions.

With respect to the standard cells SC1 through SC5 illustrated in FIG. 2, only the (cell) active regions are shown for clarity. Other cell features, such as gate electrodes, are described in greater detail below.

Figure 3A:
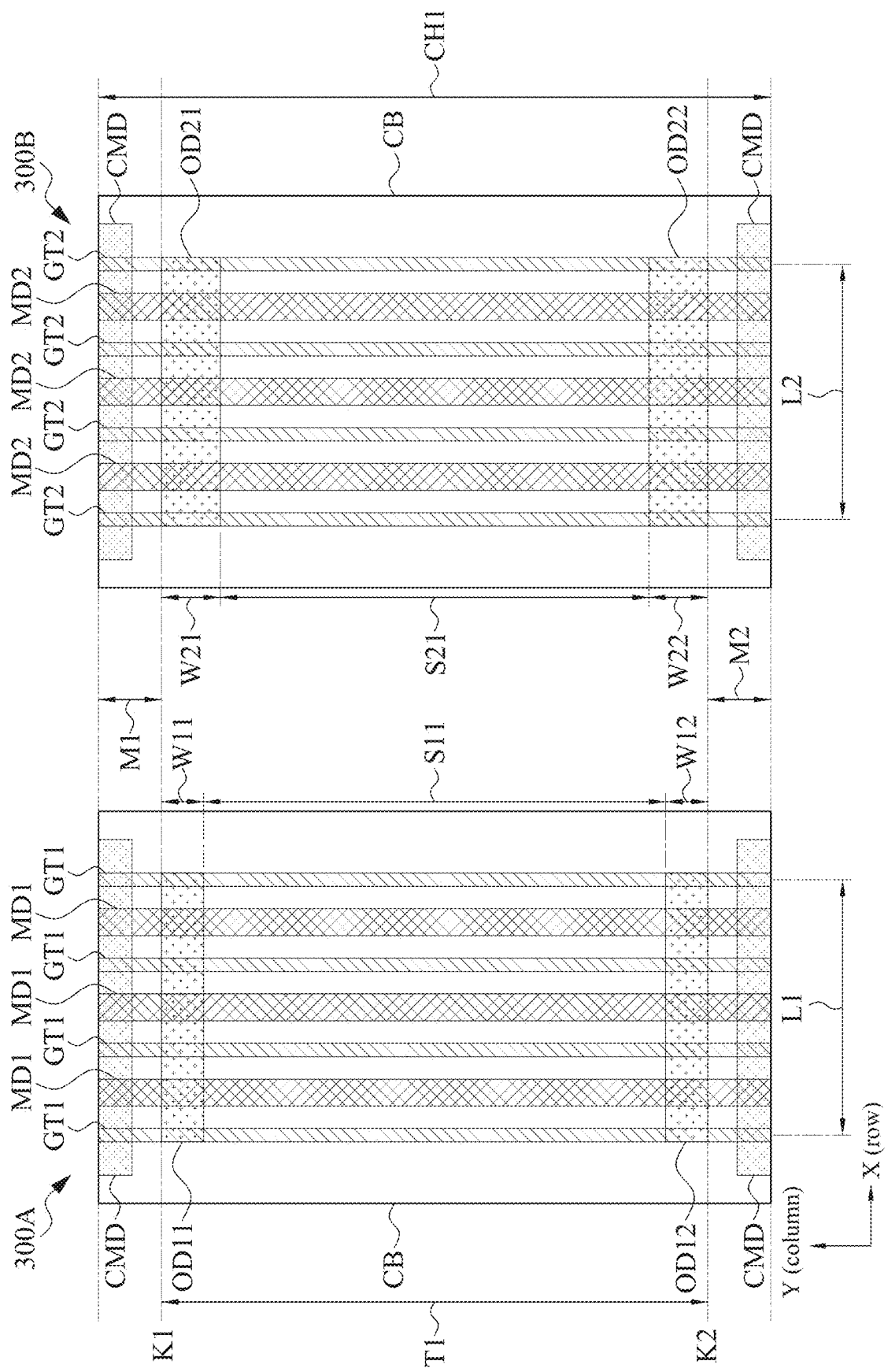
FIGS. 3A and 3B are schematic diagrams of design layouts for standard cells, in accordance with various embodiments of the present disclosure.

FIG. 3A is a schematic diagram of design layouts for standard cells 300A and 300B, in accordance with various embodiments of the present disclosure. In some embodiments, the standard cells 300A and 300B correspond to the standard cells arranged in a same row, e.g., row R1 or R2. The standard cells 300A and 300B are defined by their respective cell boundaries CB, and have cell heights CH1 equal to a row height, e.g., RH1 or RH2 in FIG. 2.

The standard cells 300A and 300B include respective gate electrodes GT1 and GT2 extending over a substrate (not shown) in the column direction. The materials of the gate electrodes GT1, GT2 are similar to the gate electrodes 106, 108 shown in FIG. 1A. The standard cell 300A further includes two active regions (OD) OD11 and OD12 extending in the row direction, in which channel regions of the active regions OD11 and OD12 are surrounded by the gate electrodes GT1. Similarly, the standard cell 300B further includes two active regions (OD) OD21 and OD22 extending in the row direction, in which channel regions of the active regions OD21 and OD22 are and wrapped around by the gate electrodes GT2.

The standard cells 300A and 300B also include respectively conductive lines MD1 and MD2 extending in the column direction between adjacent gate electrodes GT1, GT2. The conductive lines MD1, MD2 are arranged in a layer overlapping the gate electrodes GT1, GT2, and electrically coupled to the active regions OD11, OD12, OD21 and OD22. The conductive lines MD1, MD2 are configured to electrically couple source/drain regions of the active regions OD11, OD12, OD21, OD22 in the standard cells 300A, 300B, to overlying or underlying layers of the standard cells 300A, 300B. The conductive lines MD1, MD2 may be formed of doped polysilicon or metallic materials, such as copper, tungsten, titanium, titanium nitride, tantalum, tantalum nitride, or the like.

The standard cell 300A or 300B further includes a line separation pattern CMD, referred to herein as a "cut-MD pattern" extending in the row direction on an upper cell side and a lower cell side of the standard cell 300A or 300B. The cut-MD pattern CMD is used to signify an MD separation step during the semiconductor fabrication process, by which the contiguous conductive lines MD1 or MD2 extending in the column direction are segmented into aligned conductive line segments MD1 or MD2 with predetermined line lengths, as shown in the standard cell 300A or 300B. The positions of the cut-MD patterns CMD are shown in FIG. 3A for illustrational purposes. The cut-MD patterns CMD can also be arranged in other locations of the standard cell 300A or 300B for segmenting the conduction lines MD1 or MD2 extending through the standard cell 300A or 300B.

The standard cells 300A and 300B each includes a nanosheet FET formed of two active regions OD11 and OD12 or OD21 and OD22. In some embodiments, the two active regions OD11 and OD12 (or OD21 and OD22) are grouped and formed of one n-type active region and one p-type active region, or vice versa, as a basic unit to construct a semiconductor logic gate device, such as a NAND gate, an inverter gate, an XOR gate, an AND gate, a NOR gate, an AOI gate, or another suitable logic gate devices.

The grouped active regions OD11 and OD12 have equal nanosheet lengths L1 measured in the row direction, and the grouped active regions OD21 and OD22 have equal nanosheet lengths L2 measured in the row direction. In some embodiments, the nanosheet lengths L1 and L2 may be equal or different depending on various design requirements.

The grouped active regions OD11 and OD12 have nanosheet widths W11 and W12, respectively, measured in the column direction, and the grouped active regions OD21 and OD22 have nanosheet widths W21 and W22, respectively, measured in the column direction. The boundaries of these grouped active regions in each standard cell 300A or 300B are defined by lines K1 and K2. The lines K1 and K2 are defined as lines extending in the row direction parallel to the upper or lower cell side of the standard cells 300A, 300B, in which the line K1 is distant from the upper cell side by a marginal distance M1 while the line K2 is distant from the lower cell side by a marginal distance M2. The lines K1 and K2 define a flexibility width T1 measured in the column direction. The upper sides of the active region OD11 and OD21 are aligned with each other at the line K1, while the lower sides of the active regions OD12 and OD22 are aligned with each other at the line K2. In some embodiments, the marginal distances M1 and M2 and the flexibility width T1 are predetermined cell parameters that obey the constraint of the cell height CH1 of the standard cell 300A or 300B as follows:

$$CH1=M1+T1+M2.$$

A spacing in the standard cell 300A between the grouped active regions OD11 and OD12 has a spacing width S11, and a spacing in the standard cell 300B between the grouped active region OD21 and OD22 has a spacing width S21, in which the following formula holds:

$$T1=S11+W11+W12=S21+W21+W22.$$

In some embodiments, the widths and spacings of active regions, e.g., the widths W11, W12, W21 and W22 and spacings S11 and S21, are not only specifically determined according to the designer, but also are subject to the manufacturing capability. In some embodiments, although the values of the widths W11, W12, W21 and W22 and spacings S11 and S21 can be arbitrary in certain ranges for a designer, these value ranges may not pass the design rule check due to manufacturing limitations. In some embodiments, the active regions of the standard cells 300A and 300B adopt nanosheets, and the widths and spacings of the associated nanosheets as provided include only a predetermined set of numbers compliant with manufacturers' requirements. In some embodiments, these numbers are neither related to each other nor unpredictable in terms of an equation or formula.

In view of the unpredictable nature of the selected widths and spacings of the nanosheets, it may be a time-consuming work in tuning the dimensions of the nanosheets in a layout revision stage. This is because a small increment of an originally selected nanosheet width (spacing) picked from the set may not be included in the same set, and a greater incremental increase may be necessary, which usually exceeds the cell height of the standard cell at issue. As a result, an attempt to tune the width of a single nanosheet may inevitably involve alteration of cell heights across a large area of the design layout. The design cycle, area and power of the revised design layout may not be optimized due to the revised design layout in the context of nanosheet FETs.

In view of the above, some embodiments of the present disclosure propose a procedure to provide a standard cell library by generating a plurality of standard cells for nanosheet FETs with different selected nanosheet widths and spacings selected from a predetermined set of widths and spacings while ensuring that these standard cells have equal cell heights for the convenience of design layout.

FIG. 3C includes tables for determining widths and spacings of active regions in various standard cells, in accordance with some embodiments. For the description of FIG. 3C, widths and spacings of active regions are correspondingly referred to as nanosheet widths and nanosheet spacings. Tables (a) and (b) include example formulas for determining combinations of nanosheet widths and nanosheet spacings that will result in cells having different nanosheet widths but the same cell height. Tables (c) and (d) include specific examples of applying a predetermined set of nanosheet widths and nanosheet spacings in Tables (a) and (b).

In Table (a), the first row and the first column list nanosheet widths W1, W2, W3, W4 in a predetermined set of nanosheet widths. Each of the nanosheet widths W11, W12, W21 and W22 in FIG. 3A is configured to have one of the predetermined nanosheet widths W1, W2, W3, W4. In this example, W11=W12 and W21=W22, and W11 and W21 are listed in Table (a). A formula for ΔW=2*(|W11−W21|) is listed in various cells of Table (a). For example, the cell at the column corresponding to W3 and the row corresponding to W1 has a formula 2*(|W1−W3|).

In Table (b), the first row and the first column list nanosheet spacings S1, S2, S3, S4, S5 in a predetermined set of nanosheet spacings. Each of the nanosheet spacings S11, S21 in FIG. 3A is configured to have one of the predetermined nanosheet spacings S1, S2, S3, S4, S5. A formula for ΔS=|S11−S21| is listed in various cells of Table (b). For example, the cell at the column corresponding to S3 and the row corresponding to S1 has a formula |S1−S3|.

As discussed herein, in the example configuration in FIG. 3A, to achieve the same cell height CH1 in various cells, the flexibility width T1 is configured to be the same in such cells, i.e., T1=S11+W11+W12=S21+W21+W22. When ΔS=ΔW, this relationship for T1 is satisfied. In some embodiments, Tables (a) and (b) are used to calculate various values for ΔS and ΔW. A cell in Table (a) having the same value (other than zero) as a cell in Table (b) indicates ΔS=ΔW and corresponding combinations of nanosheet widths and nanosheet spacings that will result in cells having the same T1 and the same cell height.

Tables (c) and (d) show specific numeric examples for Tables (a) and (b). The first row and the first column of Table (c) list exemplary nanosheet widths selected from a predetermined set of nanosheet widths in the unit of nanometer, while the first row and the first column of Table (d) list exemplary nanosheet spacings selected from a predetermined set of nanosheet spacings in the unit of nanometer. Any nanosheet width or nanosheet spacing values not included in the predetermined set of nanosheet widths or nanosheet spacings may not pass the design rule check in an initial layout design stage or a layout revision stage. A value in a cell (x, y) of Table (c) represents a width difference ΔW calculated as described with respect to Table (a) for the nanosheet widths in the x-th row and the y-th column. Similarly, a value in a cell (x, y) of Table (d) represents a spacing difference ΔS calculated as described with respect to Table (b) for the nanosheet spacings in the x-th row and the y-th column. A cell in Table (c) and a cell in Table (d) that have the same value are indicated by the same label, e.g., one of L_a1, L_a2, L_a3, L_b1, L_b2 and L_c1.

The nanosheet widths W11, W12, W21 and W22, and corresponding nanosheet spacings S11, S21 selected for generating the standard cells 300A and 300B can be obtained from Tables (c) and (d). For example, in Table (c), the set of selected values of the widths W11=W12 and W21=W22 are provided as 15, 22, 35 and 41 (nm), while, in Table (d), the set of selected values of the spacings S11 and S21 are provided as 28, 34, 36, 40, 66 and 80 (nm, the unit is omitted for brevity hereinafter). Given the finite numbers of the selected widths and spacings, there is a finite number of combinations of nanosheet widths and nanosheet spacings that satisfy the same flexibility width T1 across the standard cells 300A and 300B.

An exemplary fulfilling condition is given with reference to the entries in Tables (c) and (d) with labels L_a1 which indicate that the flexibility width T1 is kept as 110 with W11=W12=15 and S11=80 in standard cell 300A, and W21=W22=22 and S21=66 in standard cell 300B. Similarly, another fulfilling condition is given with reference to the entries in Tables (c) and (d) with labels L_a2, which indicate that the flexibility width T1 is kept as 110 with W11=W12=15 and S11=80 in standard cell 300A, and W21=W22=35 and S21=40 in standard cell 300B. A further fulfilling condition is given with reference to the entries in Tables (c) and (d) with labels L_a3, which indicate that the flexibility width T1 is kept as 110 with W11=W12=15 and S11=80 in standard cell 300A, and W21=W22=41, and S21=28 in standard cell 300B.

Given the above, the standard cell 300A or 300B can be generated sharing an equal flexibility width T1=110 with four different combinations of selected nanosheet widths and nanosheet spacings. The cell heights CH1 of different standard cells can be kept unchanged given that the marginal distances M1 and M2 are set equal in the standard cells 300A and 300B, while the nanosheet dimensions, e.g., nanosheet width and/or nanosheet spacing, can be made various, i.e., selected from a predetermined set of nanosheet widths and nanosheet spacings, in the standard cells 300A and 300B.

As shown in FIG. 3C, six entries of Tables (c) and (d) in FIG. 3C are marked with labels (e.g., L_a1, L_a2, L_a3, L_b1, L_b2 and L_c1) to indicate the compliant combinations of nanosheet widths and nanosheet spacings to achieve equal flexibility widths T1, thereby attaining the purpose of equal cell heights of the standard cells 300A and 300B. In some embodiments, some entries of Tables (c) and (d) are left without any label, which indicates no compliant combinations exist with respect to these nanosheet widths and nanosheet spacings to achieve equal flexibility widths T1, and thus these combinations are discarded from consideration during the generation of standard cells for a standard cell library.

The marginal distance M1 or M2 is selected in a manner similar to that for selecting compliant nanosheet widths and nanosheet spacings with reference to FIG. 3C. Referring to FIG. 2 and FIG. 3A, the marginal distance M1 or M2 may be set as one half of a spacing between two adjacent active regions of two abutting standard cells, e.g., a spacing Sx between the active regions NOD3 and NOD42, i.e., M1=Sx/2. For example, the marginal distance M1 or M2 is selected from the set formed of numbers {14, 17, 18, 20, 33, 40} being half of the corresponding values {28, 34, 36, 40, 66, 80} in Table (d) of FIG. 3C. In this way, when two standard cells abut in the column direction, the adjacent marginal distance M1 or M2 of each standard cell contributes one half of the spacing between the cell boundary and a closest nanosheet, and thus the total spacing between two adjacent nanosheets of the abutting standard cells fulfill the requirement as provide in the set of the spacings shown in Table (d).

In some embodiments, the grouped active regions OD11 and OD12 (or the grouped active regions OD21 and OD22) have equal nanosheet widths to maintain comparable electrical performance for the grouped active regions OD11 and OD12 (or the grouped active regions OD21 and OD22). Under this assumption, the above formula can be further simplified as follows.

$$T1=S11+2*W11=S21+2*W21.$$

According to the above formulas, the nanosheet width W11 can be different from the nanosheet width W21 by an amount of D=|S11−S21|/2 to provide design flexibility between the standard cells 300A and 300B under the constraint of equal cell heights CH1 for the standard cells 300A and 300B. In some embodiments, the difference between the widths W11 and W21 is greater than a tolerance level due to process variations during manufacturing of the nanosheets OD11 and OD21. In some embodiments, the nanosheet width W11 is different from the nanosheet width W21 by at least 2.5% of the nanosheet width W11, by at least 5% of the nanosheet width W11 or by at least 10% of the nanosheet width W11. Accordingly, the width S11 is different from the width S21 by an amount greater than a tolerance level due to process variations during manufacturing of the nanosheets OD11 and OD21. In some embodiments, the spacing width S11 is different from the spacing width S21 by at least 5%, 10% or 20%, of the nanosheet width W11.

In some embodiments, the nanosheet width W11 or W12 in the standard cell 300A is a multiple of the nanosheet width W21 or W22, respectively, in the standard cell 300B.

In some embodiments, the flexibility widths T1 in the standard cells 300A and 300B are kept equal but may not be flush with each other along the lines K1 and K2. In other words, the marginal distances M1 and M2 in the standard cell 300A may not be equal to the corresponding marginal distances M1 and M2 in the standard cell 300B. In some embodiments, to ensure equal cell height CH1 across the standard cells 300A and 300B, the sum of marginal distances M1+M2 in the standard cell 300A is set to be equal to the sum of marginal distances M1+M2 in the standard cell 300B, in which the individual marginal distances M1 and M2 for the standard cells 300A and 300B are selected to be one half of any of the spacings in Table (d). In this way, the requirement of equal cell height CH1 can still be maintained and greater design flexibility of the standard cells can be obtained.

As discussed previously, the planar areas of the nanosheet, determined by the nanosheet length and width, are closely related to the electrical performance of the nanosheet FET. The nanosheet widths and nanosheet spacings may be selected from a predetermined set of specific numbers of nanosheet widths and nanosheet spacings due to some manufacturing constraints. Therefore, the proposed framework of standard cell generation provides as many compliant combinations of nanosheet widths and nanosheet spacings as possible for a same type of standard cell, e.g., standard cells having the same functionality, with equal cell heights. For example, a standard cell library is provided or generated to include a plurality of inverter cells having the same cell height but with different nanosheet widths and/or nanosheet spacings. These inverter cells can replace each other in the circuit design stage. This will provide benefits when revisions to the placed cell layouts are required to meet the design requirements in the circuit design stage. For example, a placed cell that fails the circuit simulation may not need to be redesigned from scratch. Rather, the failed cell, e.g., an inverter cell, can be efficiently replaced with a similar standard cell, e.g., another inverter cell, which has the same cell height but with different nanosheet widths without revising other portions of the already placed layout or alteration of the cell height. As a result, a better tradeoff between performance, area and power is achieved while the design cycles can be improved.

Figure 3B:
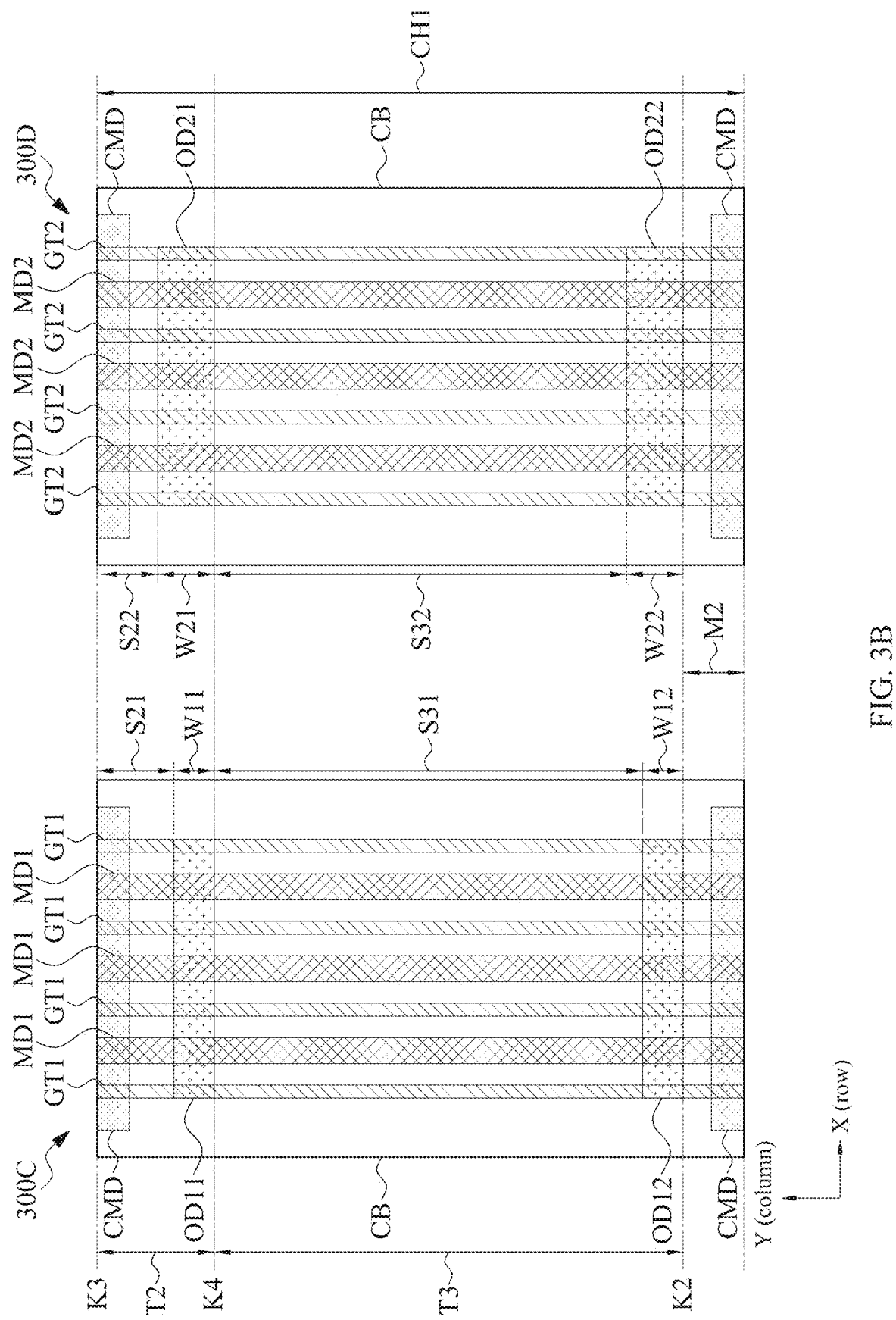

FIG. 3B is a schematic diagram of design layouts for standard cells 300C and 300D, in accordance with various embodiments of the present disclosure. The arrangements of the standard cells 300C and 300D are similar to those of the standard cells 300A and 300B, and descriptions of similar aspects are not repeated herein for brevity. Referring to FIG. 3A and FIG. 3B, new lines K3 and K4 are used to define a flexibility width T2, in which the line K3 is aligned with the upper cell sides of the standard cells 300C and 300D, and the lower sides of the active regions OD11 and OD21 are aligned with each other at the line K4. Lines K4 and K2 are used to define a flexibility width T4. As a result, the nanosheet widths W11, W12, W21 and W22 are tunable according to the following formulas:

$$T2=S21+W11=S22+W21.$$

$$T3=S31+W12=S32+W22.$$

The determination of the flexibility width T2 and the selection of compliant nanosheet widths W11, W21 and nanosheet spacings S21, S22 are performed with help of Tables (a) and (b), or Tables (c) and (d), shown in FIG. 3C, in a manner similar to that discussed for determining the flexibility width T1 shown in FIG. 3A. Similarly, the determination of the flexibility width T3 and the selection of compliant nanosheet widths W12, W22 and nanosheet spacings S31, S32 are performed with help of Tables (a) and (b), or Tables (c) and (d), shown in FIG. 3C, in a manner similar to that discussed for determining the flexibility width T1 shown in FIG. 3A. With the above arrangement, the active region OD12 can be designed to have the nanosheet width W12 independent of the nanosheet width W11 of the active region OD11 under the constraint of the flexibility width T2. Similarly, the active region OD22 can be designed to have the nanosheet width W22 independent of the nanosheet width W21 of the active region OD21 under the constraint of the flexibility width T3.

According to the above formula, the nanosheet width W12 can be different from the nanosheet width W22 by an amount of D=|S31-S32| to provide design flexibility between the standard cells 300A and 300B under the constraint of the flexibility width T3 for the standard cells 300A and 300B. In some embodiments, the difference between the widths W12 and W22 is greater than a tolerance level due to process variations during manufacturing of the nanosheets OD12 and OD22. In some embodiments, the nanosheet width W12 is different from the nanosheet width W22 by at least 2.5%, 5% or 10% of the nanosheet width W12. Accordingly, the spacing width S31 is different from the spacing width S32 by an amount greater than a tolerance level due to process variations during the manufacturing of the nanosheets OD21 and OD22. In some embodiments, the spacing width S21 is different from the spacing width S22 by at least 2.5%, 5% or 10% of the nanosheet width W21.

Figure 4A:
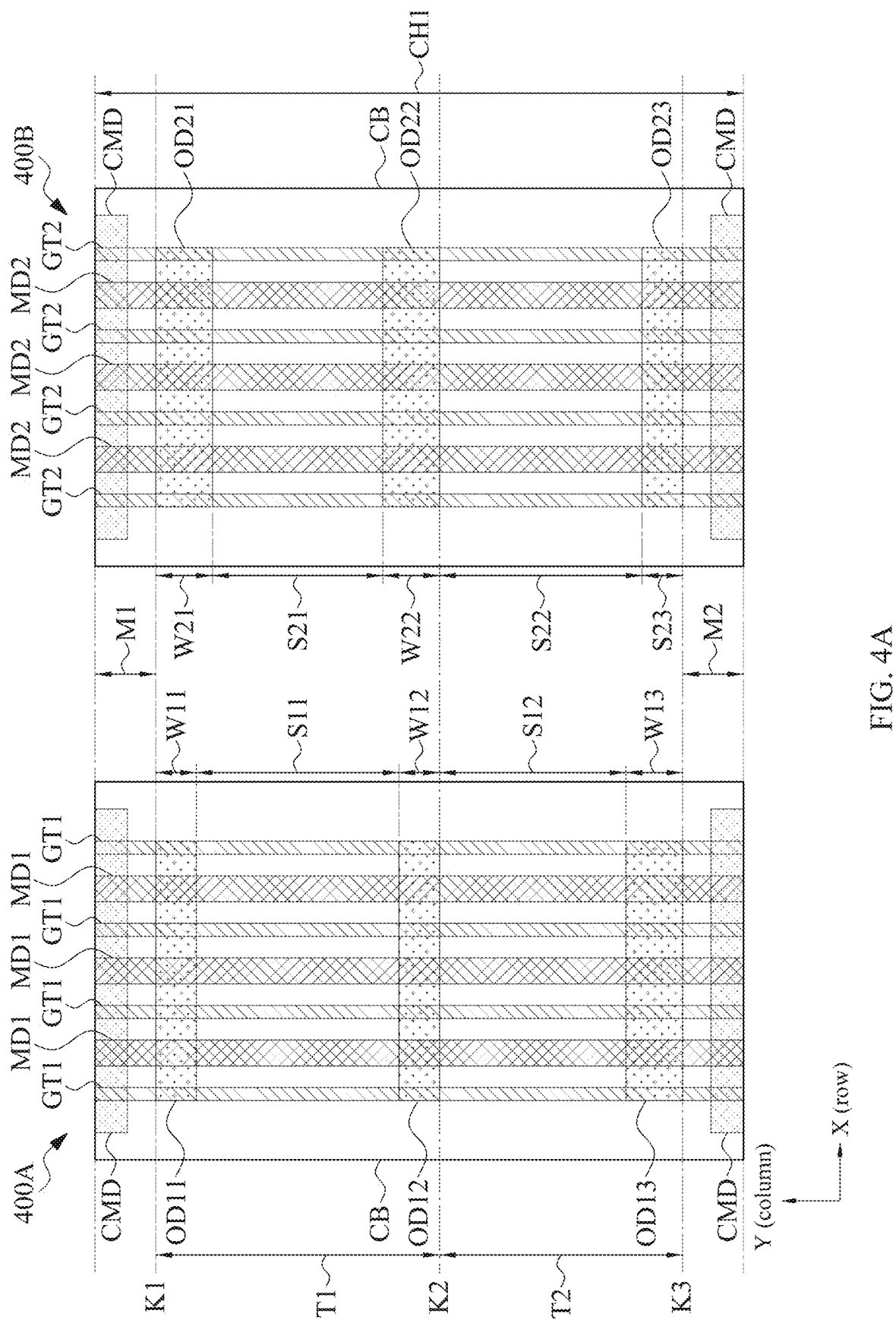
FIGS. 4A, 4B, 4C and 4D are schematic diagrams of design layouts for standard cells, in accordance with various embodiments of the present disclosure.

FIG. 4A shows schematic diagrams of design layouts for standard cells 400A and 400B, in accordance with various embodiments of the present disclosure. The arrangements of the standard cells 400A and 400B are similar to those of the standard cells 300A and 300B, and description of similar aspects are not repeated herein for brevity. Referring to FIG. 3A and FIG. 4A, the active regions OD11, OD12, OD21, OD22 and lines K1, K2 in the standard cells 400A and 400B are similar to those in the standard cells 300A and 300B. The standard cells 400A and 400B each further includes a third active region OD13 and OD23 with respective nanosheet widths W13 and W23 measured in the column direction. In some embodiments, the active region OD13 or OD23 is configured to be paired with another active region of another standard cell for forming a nanosheet FET, in which the standard cells of these paired active regions will be arranged in adjacent rows in a cell placement operation.

The nanosheet widths W11, W12, W21, W22 of the grouped active regions OD11, OD12, OD21, OD22 are defined by lines K1 and K2 and the flexibility width T1. A third line K3 is defined as a line extending in the row direction parallel to the upper or lower cell side of the standard cells 300A, 300B, in which the line K3 is distant from the lower cell side of the standard cells 300A, 300B by a marginal distance M2 while the line K2 is distant from the line K3 by a flexibility width T2. In some embodiments, the marginal distances M1 and M2 and the flexibility widths T1 and T2 are predetermined cell parameters and obey the constraint of the cell height CH1 as follows:

$$CH1=M1+T1+T2+M2.$$

The upper sides of the active regions OD11 and OD21 are aligned with each other at the line K1, while the lower sides of the active regions OD12 and OD 22 are aligned with each other at the line K2, in which the following formula holds:

$$T1=S11+W11+W12=S21+W21+W22.$$

Similarly, the lower side of the active regions OD13 and OD 23 are aligned with each other at the line K3, and a spacing width S12 or S22 exists between the active regions OD12 and OD13 or between the active region OD22 and OD23, in which the following formula holds:

$$T2=S12+W13=S22+W23.$$

In some embodiments, the nanosheet width W11, W12 or W13 in the standard cell 400A is a multiple of the nanosheet width W21, W22 or W23 associated with the same flexibility width T1 or T2 of the standard cell 400B.

The different flexibility widths T1 and T2 can be different from each other and the spacing widths S11, S12, S21 and S22 can be different from each other. As a result, the active region OD13 can be designed to have the tunable nanosheet width W13 independent of the tunable nanosheet width W11 or W12 under the constraint of the flexibility width T1. Similarly, the active region OD23 can be designed to have the tunable nanosheet width W23 independent of the tunable nanosheet width W21 or W22 under the constraint of the flexibility width T2.

Figure 4B:
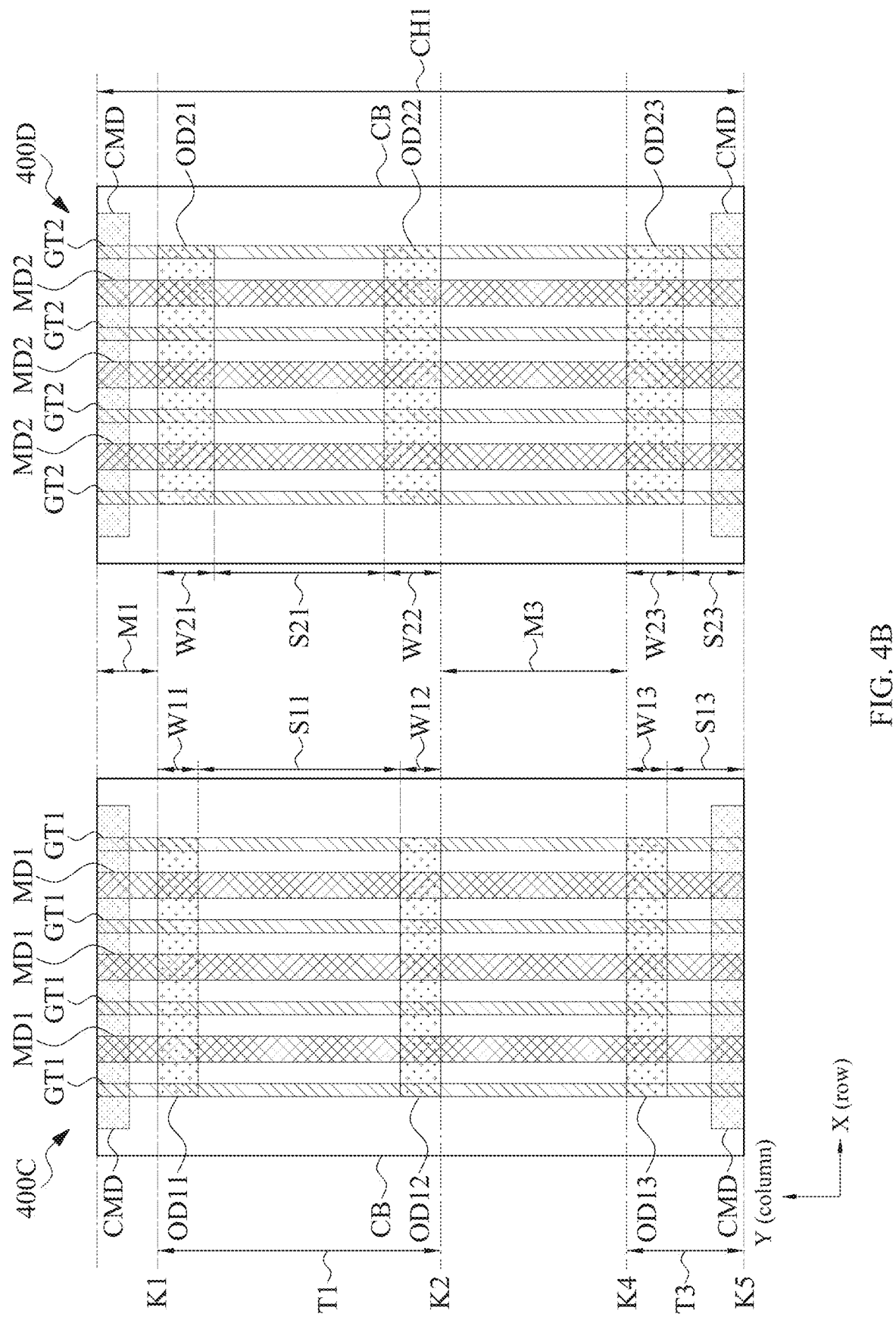

FIG. 4B shows schematic diagrams of design layouts for standard cells 400C and 400D, in accordance with various embodiments of the present disclosure. The arrangements of the standard cells 400C and 400D are similar to those of the standard cells 400A and 400B, and descriptions of similar aspects are not repeated herein for brevity. Referring to FIG. 4A and FIG. 4B, the standard cells 400C and 400D further include new lines K4 and K5 defining a flexibility width T3, for the active regions OD13 and OD23, instead of the flexibility width T2 in FIG. 4A. The upper sides of the active regions OD13 and OD23 are aligned with each other at the line K4 while the line K5 is aligned with the lower cell sides of the standard cells 400C and 400D. The line K2 is distant from the line K4 by a marginal distance M3 instead of the marginal distance M2 in FIG. 4A. As a result, the following formulas hold:

$$T3=S13+W13=S23+W23.$$

$$CH1=M1+T1+M3+T3.$$

Figure 4C:
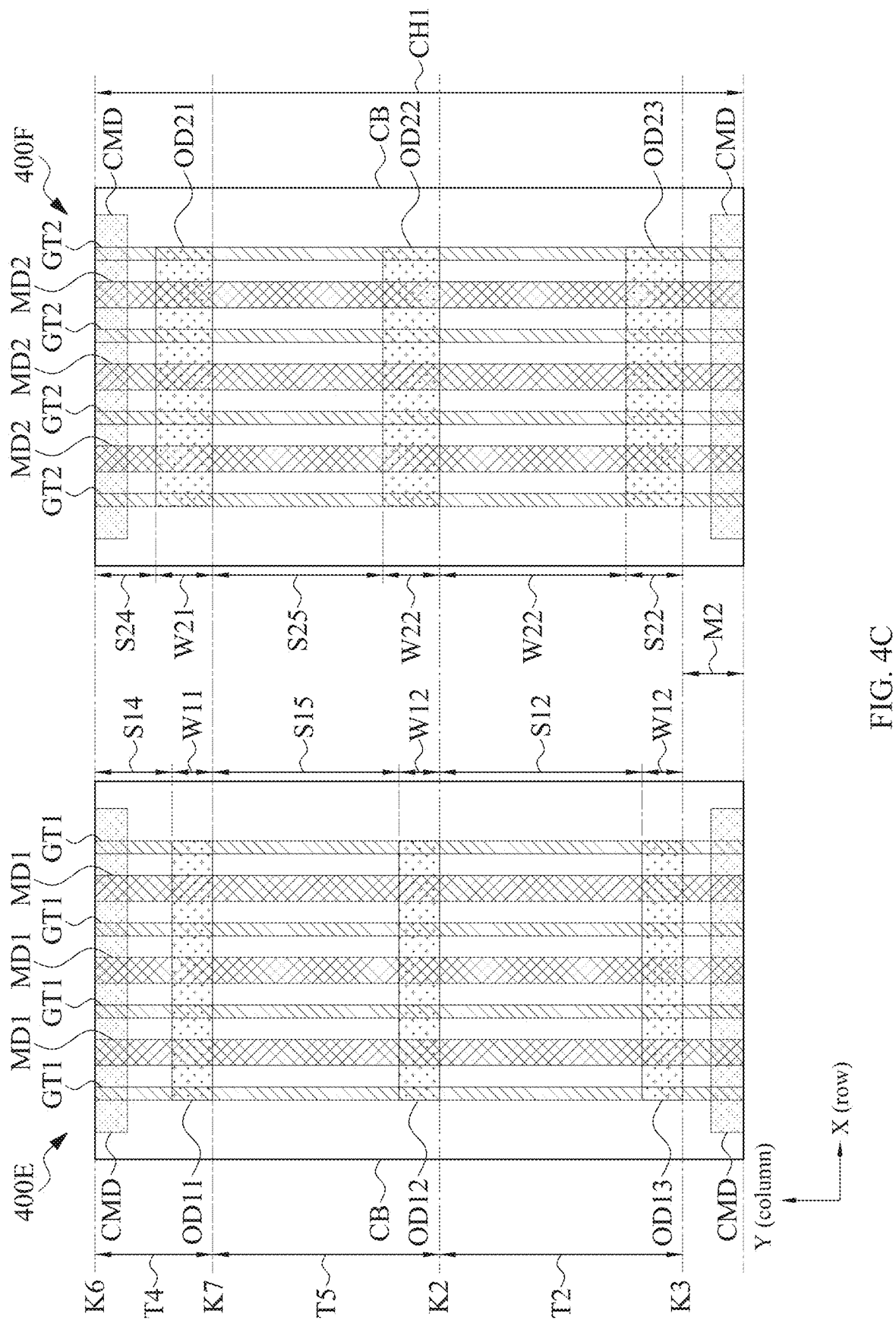

FIG. 4C shows schematic diagrams of design layouts for standard cells 400E and 400F, in accordance with various embodiments of the present disclosure. The arrangements of the standard cells 400E and 400F are similar to those of the standard cells 400A and 400B, and descriptions of similar aspects are not repeated herein for brevity. Referring to FIG. 4A and FIG. 4C, the standard cells 400E and 400F further include new lines K6 and K7 defining a flexibility width T4, for the active regions OD11 and OD21, instead of the flexibility width T1 in FIG. 4A. The line K7 further defines a flexibility width T5 with the line K2, for the active regions OD12 and OD22, instead of the flexibility width T1 in FIG. 4A. The line K6 is aligned with the upper cell sides of the standard cells 400E and 400F while the lower sides of the active regions OD11 and OD21 are aligned with each other at the line K7. A spacing width S14 or S24 is defined as a distance between the line K6 and the upper side of the active region OD11 or OD21. A spacing width S15 or S25 is defined as a distance between the line K7 and the upper side of the active region OD12 or OD22. As a result, the following formulas hold:

$$T4=S14+W11=S24+W21.$$

$$T5=S15+W12=S25+W22.$$

$$CH1=T4+T5+T2+M2.$$

Figure 4D:
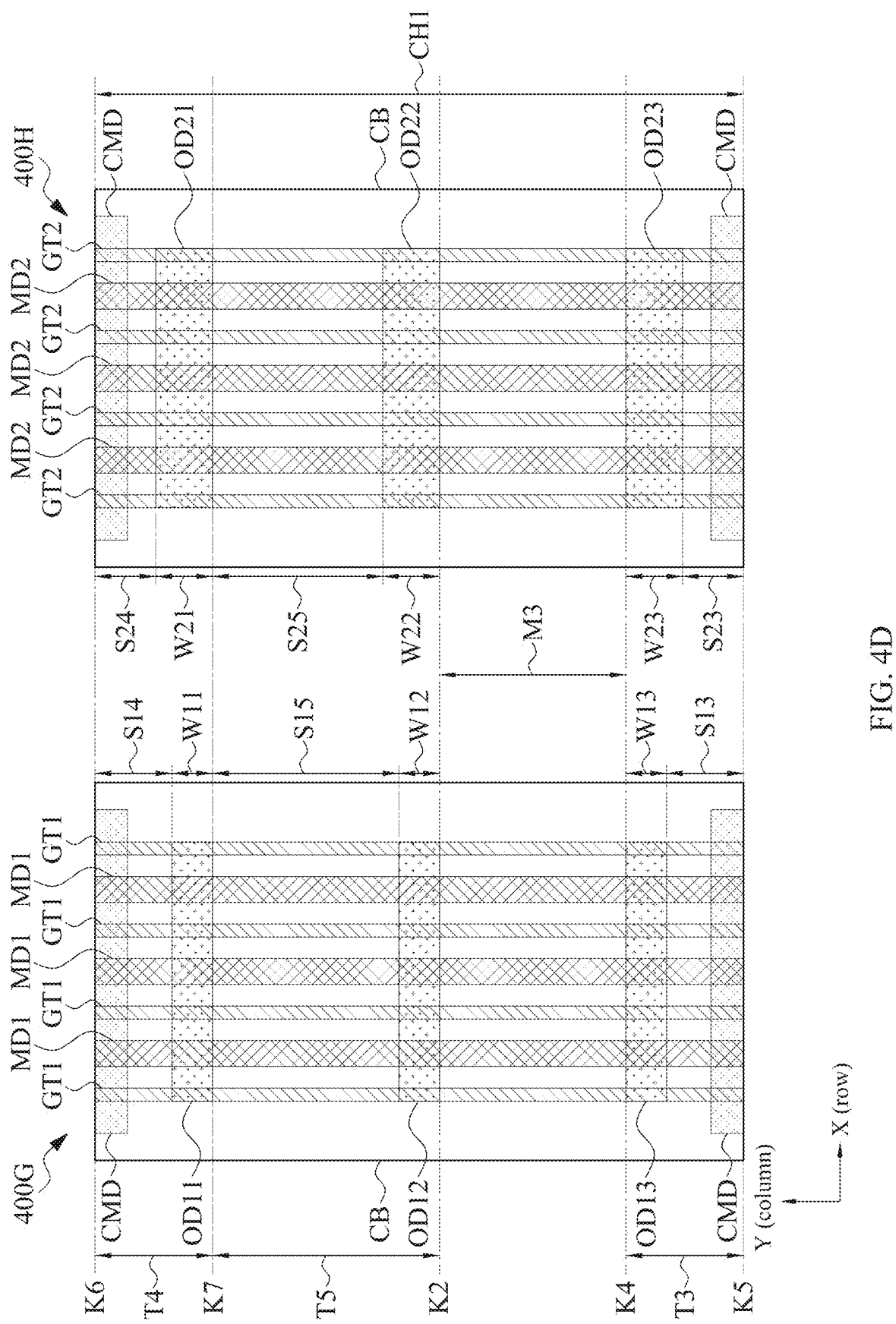

FIG. 4D shows schematic diagrams of design layouts for standard cells 400G and 400H, in accordance with various embodiments of the present disclosure. The arrangements of the standard cells 400G and 400H are similar to those of the standard cells 400C, 400D, 400E and 400F, and descriptions of similar aspects are not repeated herein for brevity. Referring to FIGS. 4B, 4C and 4D, the standard cells 400G and 400H can be seen as a combination of FIG. 4B with FIG. 4C by adopting the lines K6, K7, K2, K4 and K5 for defining the flexibility widths T4, T5 and T3, as discussed above. As a result, the following formula holds:

$$CH1=T4+T5+M3+T3.$$

Figure 5A:
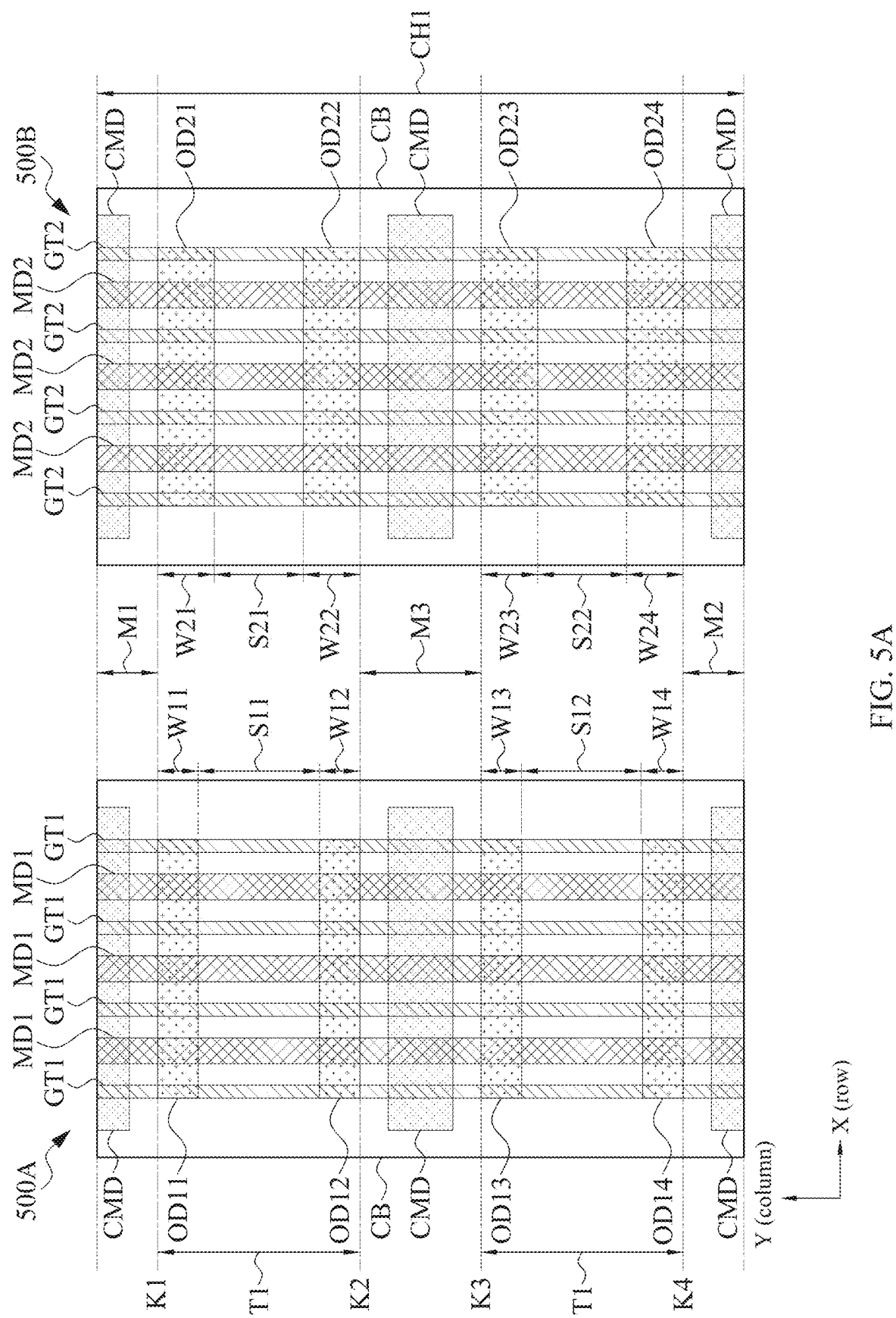
FIGS. 5A, 5B, 5C, 5D and 5E are schematic diagrams of design layouts for standard cells, in accordance with various embodiments of the present disclosure.

FIG. 5A is a schematic diagram of design layouts for standard cells 500A and 500B, in accordance with various embodiments of the present disclosure. The arrangements of the standard cells 500A and 500B are similar to those of the standard cells 400A and 400B, and descriptions of similar aspects are not repeated herein for brevity. Referring to FIG. 4A and FIG. 5A, the active regions OD11, OD12, OD21, OD22 and lines K1, K2 in the standard cells 500A and 500B are similar to those in the standard cells 400A and 400B, in which the grouped active regions OD11 and OD12 (or OD21 and OD22) are configured to form a first nanosheet FET of the standard cell 500A (or 500B). The standard cells 500A and 500B each further includes a fourth active region OD14 and OD24 with respective nanosheet widths W14 and W24 measured in the column direction. In some embodiments, the active region OD13 or OD 23 is grouped with the active region OD14 or OD24 and the grouped active regions OD13/OD23 and OD14/OD24 are configured to form a second nanosheet FET.

The nanosheet widths of the aforesaid active regions OD11 through OD14 and OD21 through OD 24 and their related parameters are defined in a way similar to those discussed in previous embodiments. For example, nanosheet widths W11, W12, W21, W22 of the grouped active regions OD11, OD12, OD21, OD22 are defined by lines K1 and K2 and a flexibility width T1 along with spacing widths S11 and S21. Nanosheet widths W13, W14, W23, W24 of the grouped active regions OD13, OD14, OD23, OD24 are defined by lines K3 and K4 and a flexibility width T2 along with spacing widths S21 and S22. The lines K1 through K4 are defined as lines extending in the row direction parallel to the upper or lower cell side of the standard cells 500A, 500B. The lines K1 and K4 are distant from the upper and lower cell sides, respectively, of the standard cells 500A and 500B by marginal distances M1 and M2, respectively. The line K2 is distant from the line K3 by a marginal distance M3. In some embodiments, the marginal distances M1, M2 and M3 and the flexibility widths T1 and T2 are predetermined cell parameters and obey the constraint of the cell height CH1 as follows:

$$CH1=M1+T1+M3+T2+M2.$$

The upper sides of the active regions OD11 and OD21 are aligned with each other at the line K1, while the lower sides of the active regions OD12 and OD 22 are aligned with each other at the line K2, in which the following formula holds:

$$T1=S11+W11+W12=S21+W21+W22.$$

The upper sides of the active regions OD13 and OD23 are aligned with each other at the line K3, while the lower sides of the active regions OD14 and OD 24 are aligned with each other at the line K4, in which the following formula holds:

$$T2=S12+W13+W14=S22+W23+W24.$$

In some embodiments, the grouped active regions, such as the active regions OD11 and OD12, OD21 and OD22, OD13 and OD23, and OD14 and OD24, have equal nanosheet widths to maintain comparable electrical performance between the grouped active regions. Under this assumption, the above formula can be further simplified as follows:

$$T1=S11+2*W11=S21+2*W21.$$

$$T2=S12+2*W13=S22+2*W23.$$

In some embodiments, the nanosheet width W11, W12, W13 or W14 in the standard cell 500A is a multiple of the nanosheet width W21, W22, W23 or W24 associated with the same flexibility width T1, T2 in the standard cell 500B.

Figure 5B:
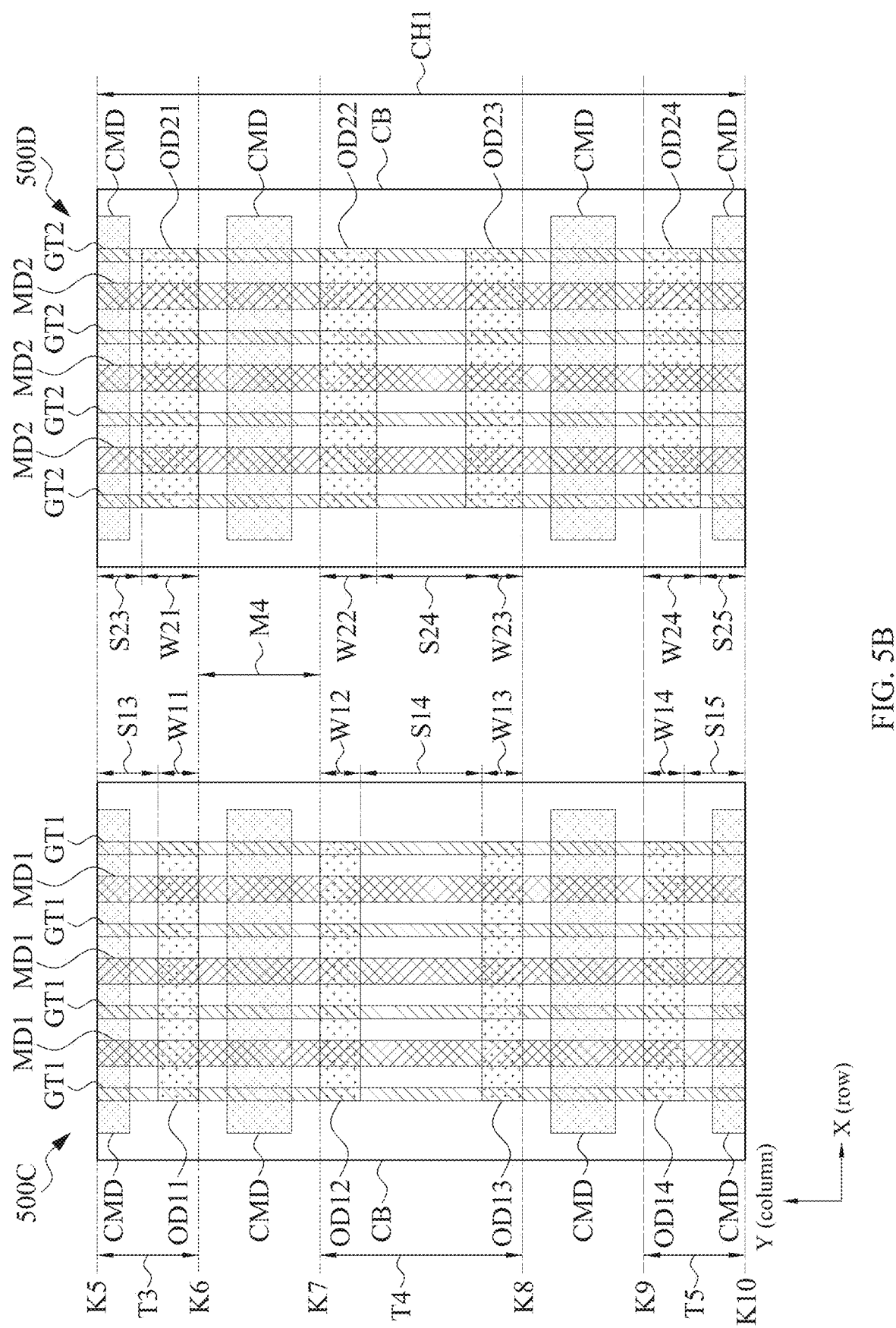

FIG. 5B shows schematic diagrams of design layouts for standard cells 500C and 500D, in accordance with various embodiments of the present disclosure. The arrangements of the standard cells 500C and 500D are similar to those of the standard cells 500A and 500B, and descriptions of similar aspects are not repeated herein for brevity. Referring to FIG. 5A and FIG. 5B, the standard cells 500C and 500D further include new lines K5, K6, K7, K8, K9 and K10 defining flexibility widths T3, T4 and T5, along with respective spacing widths S13, S23, S14, S24, S15 and S25, instead of the flexibility widths T1 and T2 in FIG. 4A. The lines K5 and K10 are aligned with the upper and lower cell sides, respectively, of the standard cells 500A, 500B. The lower sides of the active regions OD11 and OD21 are aligned with each other at the line K6. The upper sides of the active regions OD12 and OD22 are aligned with each other at the line K7 while the lower sides of the active regions OD13 and OD23 are aligned with each other at the line K8. The upper sides of the active regions OD14 and OD24 are aligned with each other at the line K9.

The line K6 is distant from the line K7 by a marginal distance M4 and the line K8 is distant from the line K9 by a marginal distance M5. As a result, the following formulas hold:

$$T3=S13+W11=S23+W21.$$

$$T4=S14+W12+W13=S24+W22+W23.$$

$T5=S15+W14=S25+W24.$ $CH1=T3+M4+T4+M5+T5.$

Figure 5C:
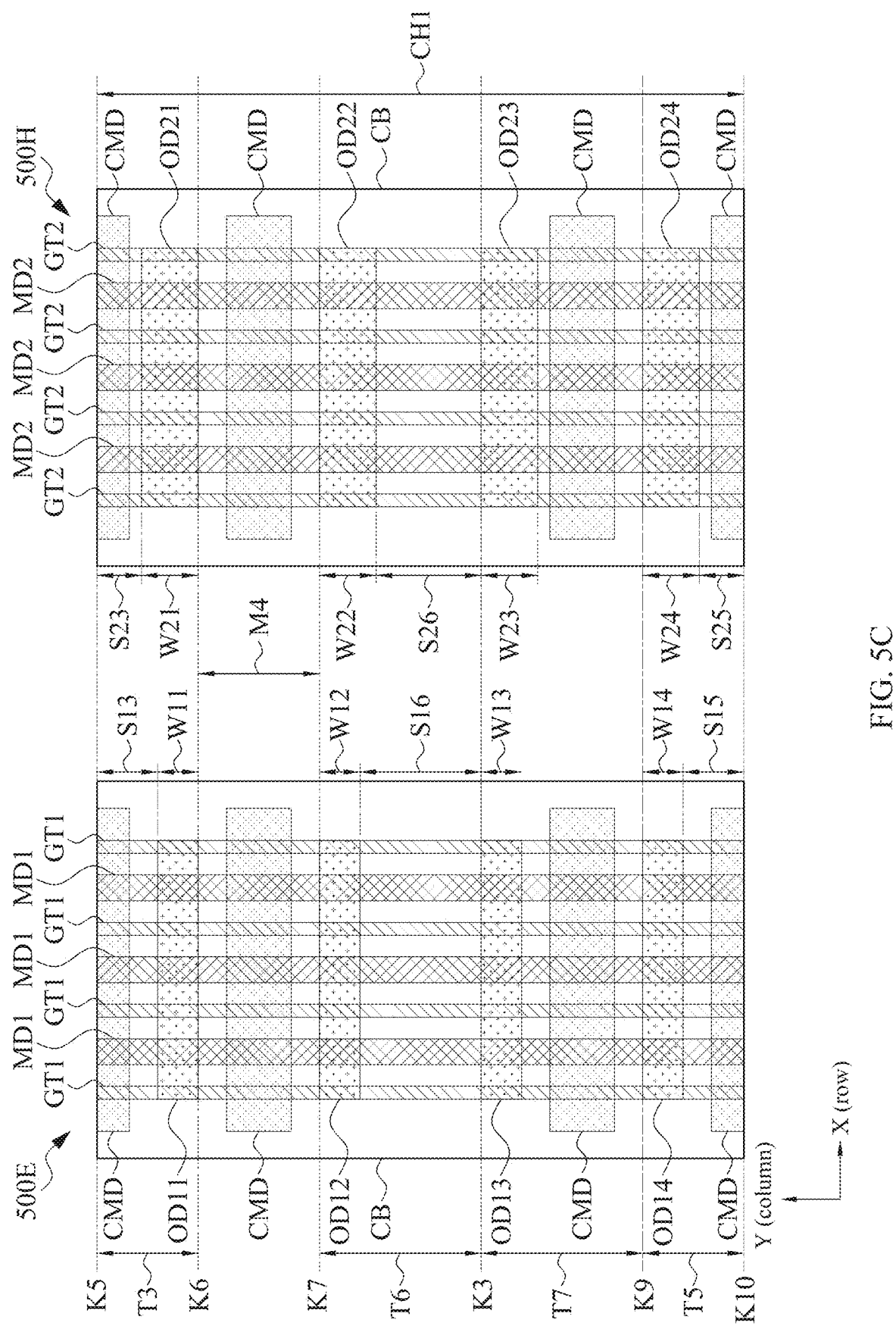

FIG. 5C shows schematic diagrams of design layouts for standard cells 500E and 500F, in accordance with various embodiments of the present disclosure. The arrangements of the standard cells 500E and 500F are similar to those of the standard cells 500A, 500B, 500C and 500D, and descriptions of similar aspects are not repeated herein for brevity. Referring to FIGS. 5A, 5B and 5C, the standard cells 500E and 500F can be seen as a combination of FIG. 5A with FIG. 5B, in which new flexibility widths T6 and T7 are defined by the lines K7, K3 and K9 along with respective spacing widths S16, S26, S17 and S27 for replacing the flexibility width T4. As a result, the following formulas hold:

$CH1=T3+M4+T6+T7+T5.$

In this way, the active region OD12 or OD22 can be designed to have the nanosheet width W12 or W22 independent of the nanosheet width W13 or W23 of the active region OD13 or OD23 under the constraint of the flexibility width T6. Similarly, the active region OD13 or OD 23 can be designed to have the nanosheet width W13 or W23 independent of the nanosheet width W12 or W22 of the active region OD12 or OD22 under the constraint of the flexibility width T7.

Figure 5D:
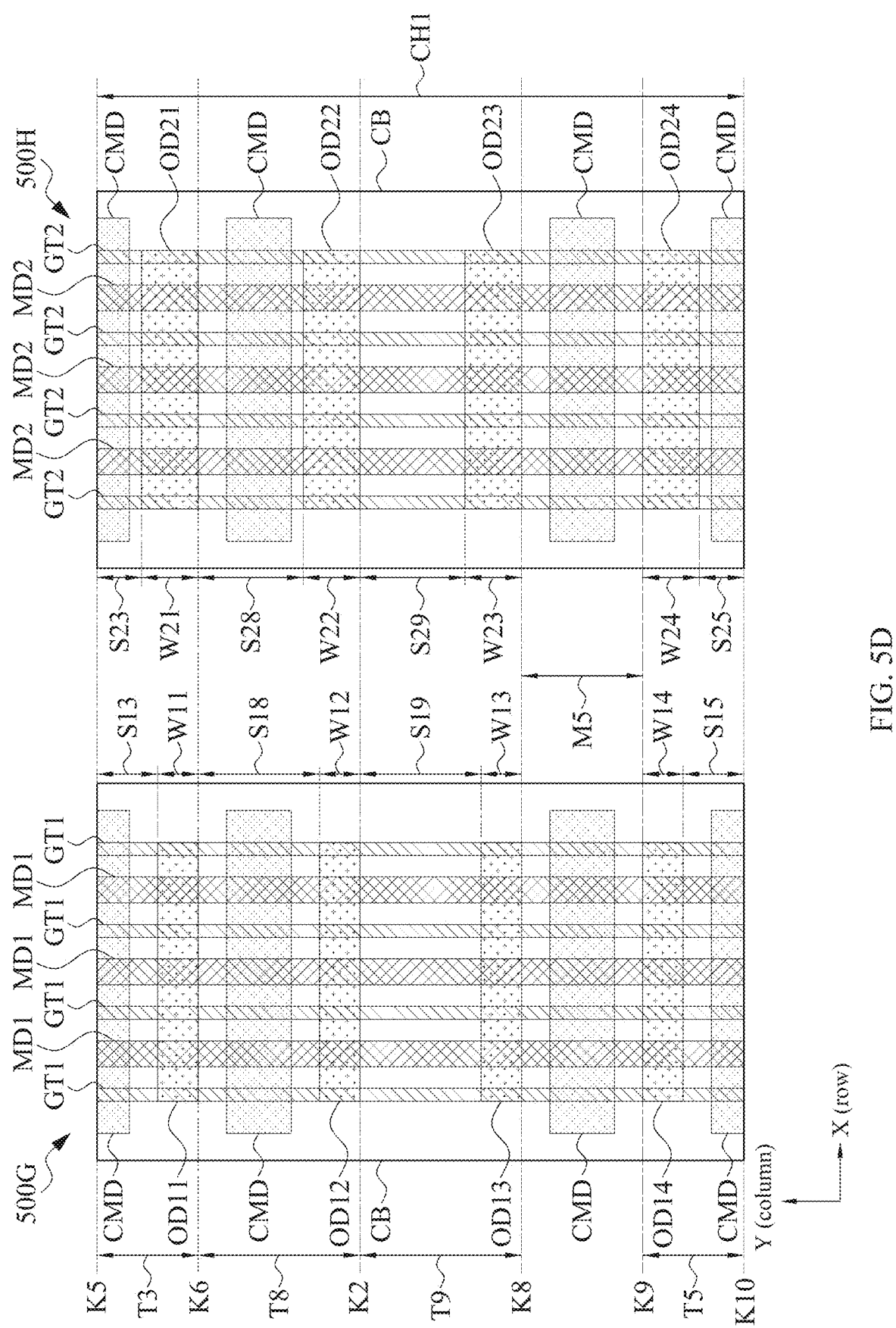

FIG. 5D shows schematic diagrams of design layouts for standard cells 500G and 500H, in accordance with various embodiments of the present disclosure. The arrangements of the standard cells 500G and 500H are similar to those of the standard cells 500A, 500B, 500C and 500D, and descriptions of similar aspects are not repeated herein for brevity. Referring to FIGS. 5A, 5B and 5D, the standard cells 500G and 500H can be seen as a combination of FIG. 5A with FIG. 5B, in which new flexibility widths T8 and T9 are defined by the lines K6, K2 and K8 along with respective spacing widths S18, S28, S19 and S29 for replacing the flexibility width T4. As a result, the following formulas hold:

$CH1=T3+T8+T9+M5+T5.$

Figure 5E:
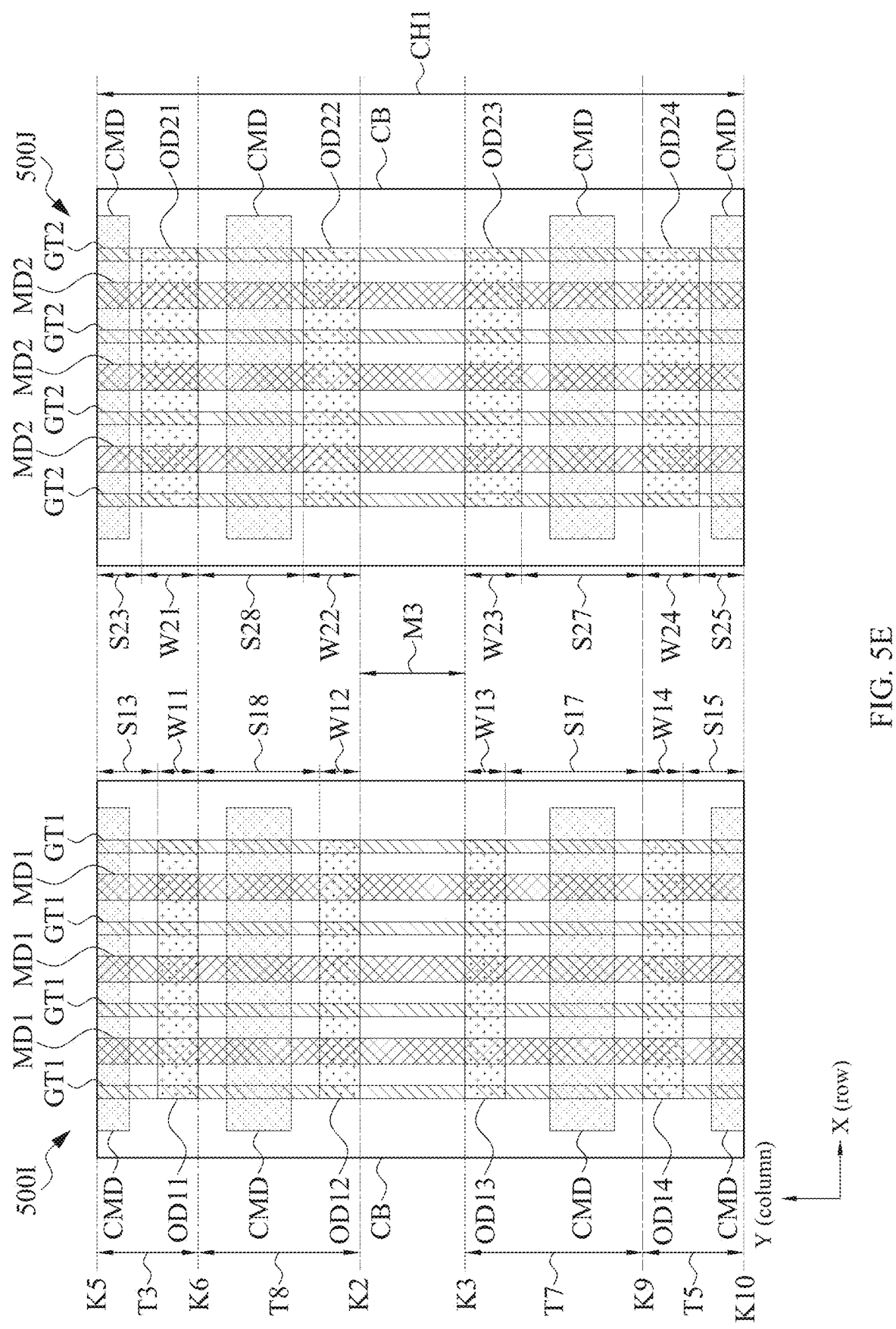

FIG. 5E shows schematic diagrams of design layouts for standard cells 500I and 500J, in accordance with various embodiments of the present disclosure. The arrangements of the standard cells 500I and 500J are similar to those of the standard cells 500A, 500B, 500C and 500D, and descriptions of similar aspects are not repeated herein for brevity. Referring to FIGS. 5A, 5B and 5E, the standard cells 500I and 500J can be seen as a combination of FIG. 5A with FIG. 5B, in which the flexibility widths T7 and T8 are defined instead of the flexibility width T4. As a result, the following formula holds:

$CH1=T3+T8+M3+T7+T5.$

Figure 6A:
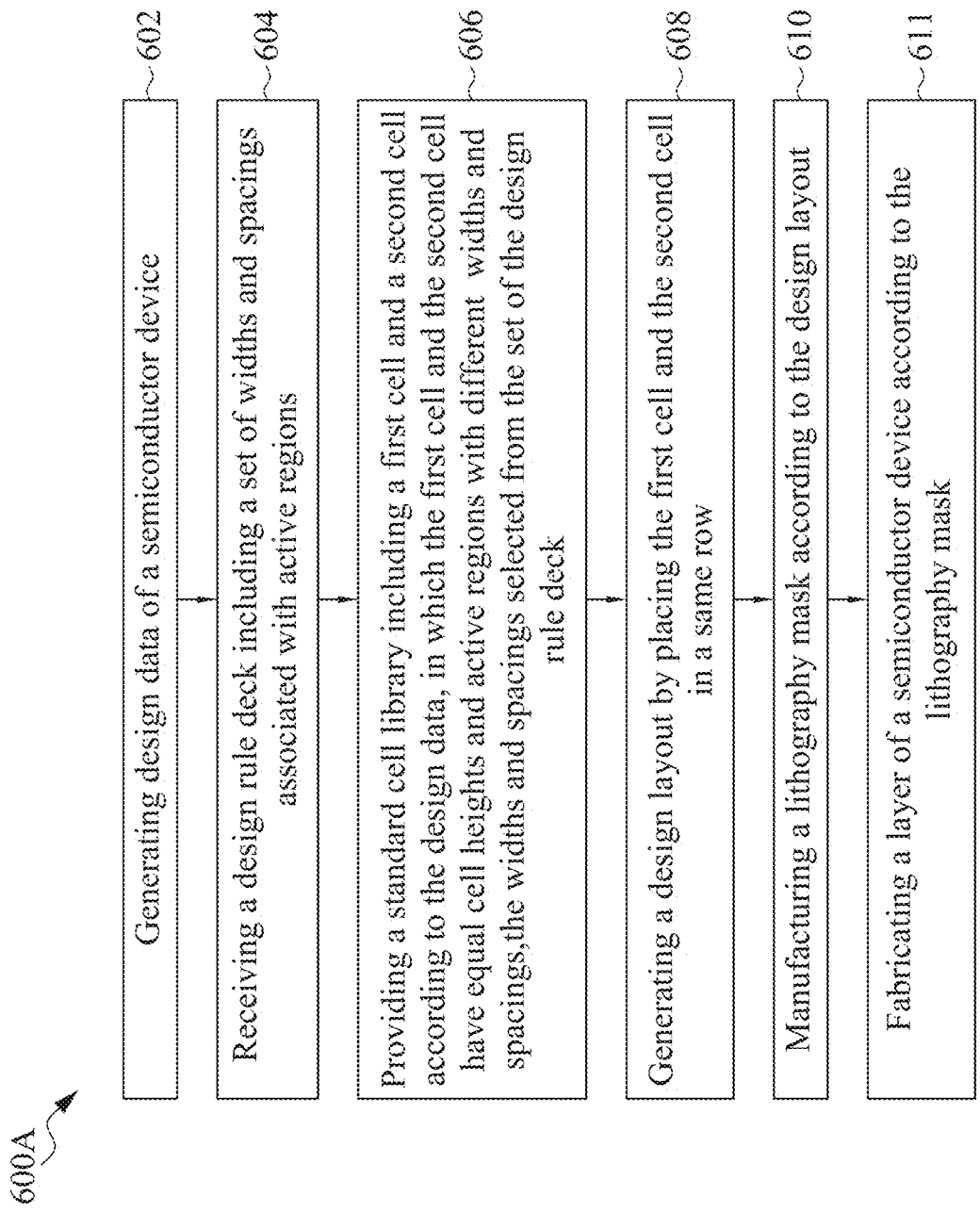
FIG. 6A is a flowchart of a layout method, in accordance with some embodiments.

FIG. 6A is a flowchart of a layout method 600A, in accordance with some embodiments. It should be understood that additional steps can be provided before, during, and after the steps shown in these figures, and some of the steps described below can be replaced or eliminated in other embodiments of the method 600A. The order of the steps may be interchangeable.

At step 602, design data of a semiconductor device are generated or received. The design data may be represented as a netlist, a schematic diagram, a circuit diagram or the like. In some embodiments, the semiconductor device includes at least one electronic circuit, which can be a logic gate device in various types, such as a NAND gate, an inverter gate, an XOR gate, an AND gate, a NOR gate, an AOI gate, or another suitable logic gate device. In some embodiments, the design data in step 602 are generated during a synthesis stage of a design flow for manufacturing the semiconductor device.

At step 604, a design rule deck is received. In some embodiments, the design rule deck includes design rules, such as a predetermined set of specified values of widths and spacings associated with active regions. In some embodiments, the active regions are implemented by nanosheets, and the predetermined set includes specified values of nanosheet widths and nanosheet spacings. In some embodiments, the specified widths and spacings are provided by a semiconductor manufacturer or circuit designer. In some embodiments, the specified values of the widths and spacings are unrelated to each other and are unpredictable through an equation or formula. In some embodiments, the specified values of the widths and spacings are elements of an irregular data sequence.

At step 606, a standard cell library is provided according to the design data, and includes a first cell and a second cell, e.g., standard cells 300A and 300B. The first cell comprises a first active region having a first width, and the second cell comprises a second active region having a second width different from the first width. In some embodiments, each of the first cell and the second cell includes a nanosheet FET having a respective nanosheet stack, in which a first nanosheet stack of the first cell overlaps a second nanosheet stack of the second cell in the row direction. The first cell and the second cell have equal cell heights. In some embodiments, the first nanosheet stack and the second nanosheet stack have different nanosheet widths and nanosheet spacings, which are selected from the predetermined set of widths and spacings of the design rule deck. The first cell and the second cell are discussed above and are not repeated for brevity.

At step 608, a design layout is generated by placing the first cell and the second cell, e.g., in a same row, according to the design data. The step 608 may be performed during a placement and routing stage of a design flow for manufacturing a semiconductor device.

At step 610, a lithography mask is manufactured according to the design layout. At step 611, a semiconductor device is fabricated in which a layer of the semiconductor device is formed according to the lithography mask. In some embodiments, the semiconductor device is fabricated according to the design layout.

Figure 6B:
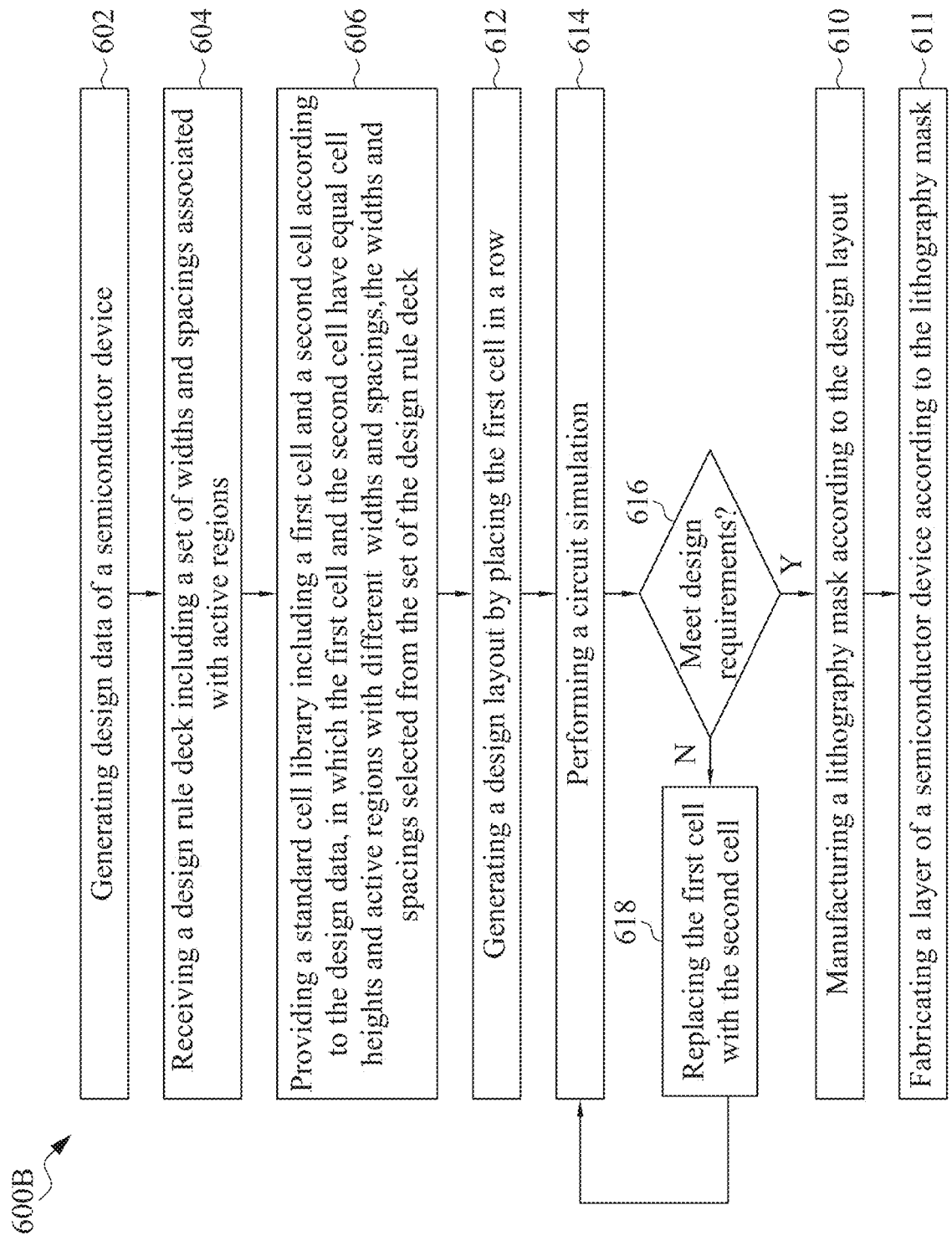
FIG. 6B is a flowchart of a layout method, in accordance with some embodiments.

FIG. 6B is a flowchart of a layout method 600B, in accordance with some embodiments. It should be understood that additional steps can be provided before, during, and after the steps shown in these figures, and some of the steps described below can be replaced or eliminated in other embodiments of the method 600B. The order of the steps may be interchangeable.

The steps 602, 604, 606, 610 and 611 of the method 600B are similar to those of method 600A, and thus descriptions of these steps are simplified. At step 602, design data of a semiconductor device are generated or received. At step 604, a design rule deck is received including a predetermined set of specified values for widths and spacings for active regions, e.g., nanosheet widths and nanosheet spacings. At step 606, a standard cell library is provided which includes a first cell and a second cell according to the design data. In some embodiments, the first cell and the second cell have equal cell heights, and corresponding first and second active regions with different first and second widths. In some embodiments, the first and second active regions comprise first and second nanosheet stacks with different nanosheet widths and nanosheet spacings. In some embodiments, the different nanosheet widths and nanosheet spacings are selected from the predetermined set of nanosheet widths and nanosheet spacings of the design rule deck.

At step 612, a design layout is generated by placing the first cell in a row. The step 612 may be performed during a placement and routing stage of a design flow for manufacturing a semiconductor device.

At step 614, a circuit simulation is performed to examine the physical characteristics and the electrical performance of the design layout. In some embodiments, the circuit simulation includes a post-layout simulation. In some embodiments, additional steps, such as parasitic parameter extraction and timing analysis, may be performed to provide layout-related information to support the circuit simulation. At step 616, it is determined whether the design layout meets the design requirement according to the circuit simulation result.

If affirmative, at step 610, a lithography mask is manufactured according to the design layout. At step 611, a semiconductor device fabricated in which a layer of the semiconductor device is formed according to the lithography mask. In some embodiments, the semiconductor device is fabricated according to the design layout.

If it is determined that the first cell fails the circuit simulation, that means a circuit revision is required. At step 618, the first cell is replaced with the second cell of the same cell height, and the method 600B loops back to step 616 for performing another circuit simulation. In some embodiments, the second cell has a nanosheet width greater than that of the first cell and thus is capable of providing greater circuit performance than the first cell given the same cell height. In some embodiments, since the second cell resembles the first cell in most portions of the cell layout except for the nanosheet width, the difference between the original design layout incorporating the first cell and the revised design layout incorporating the second cell is minimized. In this way, the likelihood of revising the remaining portions of the revised design layout is reduced or minimized accordingly, and the cycle time of revising the design layout can be greatly shortened.

Figure 7A:
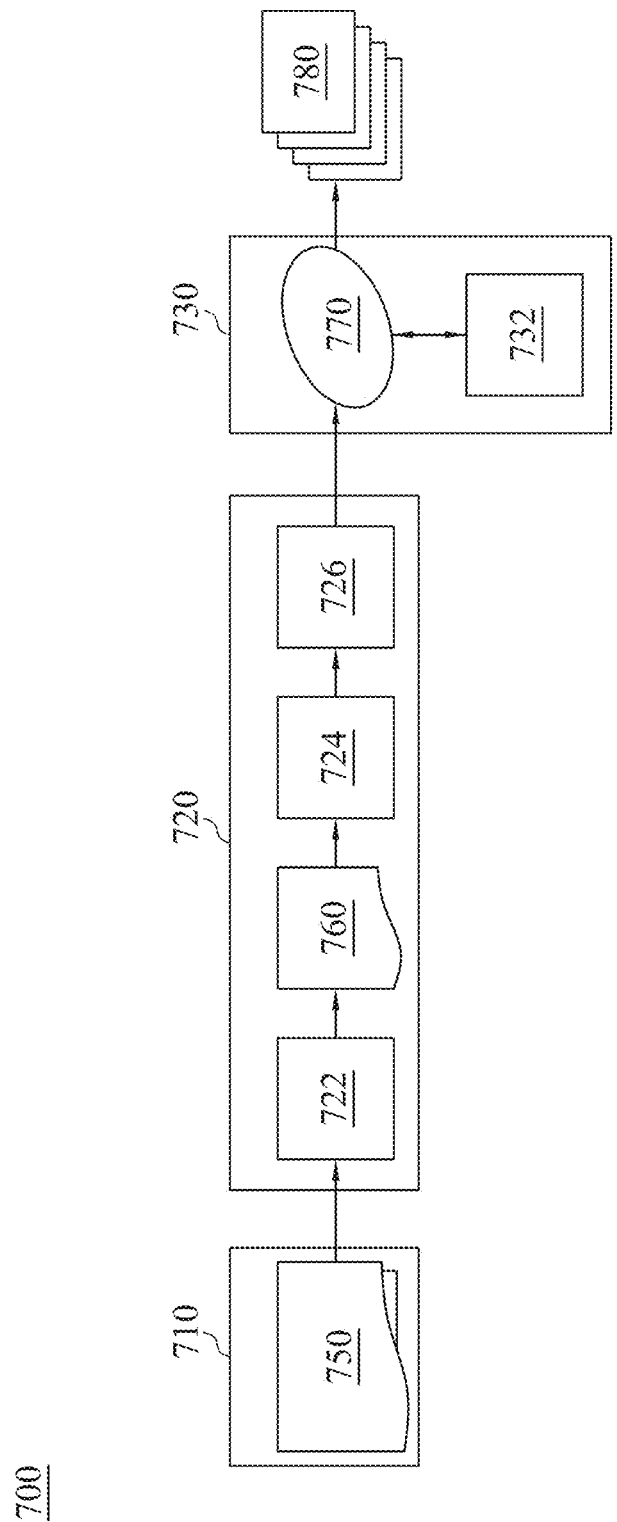
FIG. 7A is a schematic diagram showing an integrated circuit (IC) manufacturing system, in accordance with some embodiments.

FIG. 7A is a schematic diagram 700 showing an integrated circuit (IC) manufacturing system, in accordance with some embodiments. The IC manufacturing system 700 is configured to manufacture an IC device 780 through a plurality of entities, such as a design subsystem 710, a mask subsystem 720, and a fabrication subsystem 730. The entities in the IC manufacturing system 700 may be linked by a communication channel, e.g., a wired or wireless channel, and interact with one another through a network, e.g., an intranet or the internet. In an embodiment, the design subsystem 710, the mask subsystem 720 and the fabrication subsystem 730 belong to a single entity, or are operated by independent parties.

The design subsystem 710, which may be provided by a design house or a layout design provider, generates a design layout 750, e.g., the design layout 200, in a design phase for the IC devices 780 to be fabricated. The design subsystem 710 may perform the layout methods discussed in the present disclosure to generate the design layout 750, e.g., the design layouts shown with reference to the figures of the present disclosure. In an embodiment, the design subsystem 710 operates a circuit design procedure to generate the design layout 750. The design subsystem 710 may include further one or more steps, such as logic design, physical design, pre-layout simulation, placement and routing, timing analysis, parameter extraction, design rule check and post-layout simulation, to generate the design layout 750. The design layout 750 may be converted from description texts into their visual equivalents to show a physical layout of the depicted patterns, such as the dimensions, shapes and locations thereof. In an embodiment, the design layout 750 can be expressed in a suitable file format such as GDSII, DFII, OASIS, or the like.

The mask subsystem 720 receives the design layout 750 from the design subsystem 710 and manufactures one or more masks (photomask, lithography masks or reticles) according to the design layout 750. In an embodiment, the mask subsystem 720 includes a mask data preparation block 722, a mask fabrication block 724 and a mask inspection block 726. The mask data preparation block 722 modifies the design layout 750 so that a revised design layout 760 can allow a mask writer to transfer the design layout 750 to a writer-readable format.

The mask fabrication block 724 is configured to fabricate the one or more masks by preparing a substrate based on the design layout 760 provided by the mask data preparation block 722. A mask substrate is exposed to a radiation beam based on the pattern of the design layout 760 in a writing operation, which may be followed by an etching operation to leave behind the patterns corresponding to the design layout 760. In an embodiment, the mask fabrication block 724 includes a checking procedure to ensure that the layout data 760 complies with requirements of a mask writer and/or a mask manufacturer to generate the mask as desired. An electron-beam (e-beam), multiple e-beams, an ion beam, a laser beam or other suitable writer source may be used to transfer the patterns.

After the one or more masks are fabricated, the mask inspection block 726 inspects the fabricated masks to determine if any defects, such as full-height and non-full-height defects, exist in the fabricated mask. If any defects are detected, the mask may be cleaned or the design layout in the mask may be modified.

The fabrication subsystem 730 is an IC manufacturing entity that includes multiple manufacturing facilities or tools for the fabrication of a variety of the IC devices 780. The fabrication subsystem 730 uses the mask fabricated by the mask subsystem 720 to fabricate a wafer 770 having a plurality of IC devices 780 thereon. The wafer 770 includes a semiconductor substrate and optionally various layers formed thereon. The operations provided by the manufacturing facilities or tools may include, but are not limited to, photolithography, deposition, sputtering, etching, diffusion, ion implantation and annealing. In some embodiments, test structures may be formed on the wafer 770 to generate test data indicative of the quality of the fabricated wafer 770. In an embodiment, the fabrication subsystem 730 includes a wafer testing block 732 configured to ensure that the wafer 770 conforms to physical manufacturing specifications and mechanical and/or electrical performance specifications. After the wafer 770 passes the testing procedure performed by the wafer testing block 732, the wafer 770 may be diced (or sliced) along the scribe line regions to form separate IC devices 780. The dicing process can be accomplished by scribing and breaking, by mechanical sawing (e.g., with a dicing saw) or by laser cutting.

FIG. 7B is a schematic diagram of a system 700 for implementing or storing the design layouts discussed above, in accordance with some embodiments. The system 700 includes a processor 701, a network interface 703, an input and output (I/O) device 705, a storage device 707, a memory 709, and a bus 708. The bus 708 couples the network interface 703, the I/O device 705, the storage device 707, the memory 709 and the processor 701 to each other.

The processor 701 is configured to execute program instructions that include a tool configured to generate the design layouts as described and illustrated with reference to figures of the present disclosure.

The network interface 703 is configured to access program instructions and data accessed by the program instructions stored remotely through a network (not shown).

The I/O device 705 includes an input device and an output device configured for enabling user interaction with the system 700. In some embodiments, the input device includes, for example, a keyboard, a mouse, and other devices. Moreover, the output device includes, for example, a display, a printer, and other devices.

The storage device 707 is configured for storing the design layouts, one or more cell libraries including the configurations and settings of the standard cells as discussed previously, program instructions and data accessed by the program instructions. In some embodiments, the storage device 707 includes a non-transitory computer-readable storage medium, for example, a magnetic disk and an optical disk.

The memory 709 is configured to store program instructions to be executed by the processor 701 and data accessed by the program instructions. In some embodiments, the memory 709 includes any combination of a random access memory (RAM), some other volatile storage device, a read-only memory (ROM), and some other non-volatile storage device.

According to an embodiment, a method includes: receiving a design rule deck including a predetermined set of widths and spacings associated with active regions. The method also includes providing a cell library including cells having respective active regions, wherein widths and spacings of the active regions are selected from the predetermined set of the design rule deck. The method includes placing a first cell and a second cell from the cell library in a design layout. The first cell has a cell height in a first direction, and the first cell comprises a first active region having a first width in the first direction. The second cell has the cell height, and the second cell comprises a second active region having a second width in the first direction. The second width is different from the first width. The method further comprises manufacturing a semiconductor device according to the design layout.

According to an embodiment, a method comprises placing a first cell and a second cell in a first row of a design layout. The first cell comprises a first active region and a second active region. The first active region is separated from the second active region by a first distance in a first direction. The second cell comprises a third active region and a fourth active region. The third active region is separated from the fourth active region by a second distance in the first direction. The second distance is different from the first distance. The method further comprises manufacturing a semiconductor device according to the design layout.

According to an embodiment, a non-transitory computer readable storage medium comprises instructions which, when executed by a processor, cause the processor to perform a circuit simulation of an operation of a design layout comprising a first cell. The first cell has a cell height in a first direction, and the first cell comprises a plurality of first nanosheets having a first width in the first direction. In response to the circuit simulation failing to meet a design requirement, the processor is caused to replace the first cell in the design layout with a second cell to obtain a revised design layout. The second cell has the cell height, and the second cell comprises a plurality of second nanosheets having a second width in the first direction. The second width is greater than the first width. The processor is further caused to control manufacturing of a semiconductor device according to the revised design layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
placing a first cell in a first row of a design layout, wherein the first cell comprises a first active region and a second active region, wherein the first active region is separated from the second active region by a first distance in a first direction;
placing a second cell in the first row of the design layout, wherein the second cell comprises a third active region and a fourth active region, wherein the third active region is separated from the fourth active region by a second distance in the first direction, the second distance different from the first distance; and
manufacturing a semiconductor device according to the design layout,
wherein
the first cell further comprises a fifth active region adjacent to the second active region and a sixth active region adjacent to the fifth active region, and
the fifth active region is separated from the sixth active region by a third distance in the first direction, the third distance different from the first distance.

2. The method according to claim 1, wherein
the second cell comprises a seventh active region adjacent to the fourth active region in the first direction, and an eighth active region adjacent to the seventh active region in the first direction, and
the seventh active region is separated from the eighth active region by a fourth distance in the first direction, the fourth distance different from the third distance.

3. The method according to claim 2, wherein
a distance in the first direction between the second active region and the fifth active region is equal to a distance in the first direction between the fourth active region and the seventh active region.

4. The method according to claim 2, wherein
a distance in the first direction between an upper side of the first active region and a lower side of the sixth active region is equal to a distance in the first direction between an upper side of the third active region and a lower side of the eighth active region.

5. The method according to claim 2, wherein, along the first direction,
the second active region is between the first active region and the fifth active region,
the fifth active region is between the second active region and the sixth active region, the fourth active region is between the third active region and the seventh active region, and the seventh active region is between the fourth active region and the eighth active region.

6. The method according to claim 5, wherein
the first active region has a lower side facing the second active region in the first direction,
the third active region has a lower side facing the fourth active region in the first direction, and
the lower side of the first active region is aligned with the lower side of the third active region.

7. The method according to claim 6, wherein
the second active region has an upper side facing the first active region in the first direction,
the fourth active region has an upper side facing the third active region in the first direction, and
the upper side of the second active region is aligned with the upper side of the fourth active region.

8. The method according to claim 7, wherein
the fifth active region has a lower side facing the sixth active region in the first direction,
the seventh active region has a lower side facing the eighth active region in the first direction, and
the lower side of the fifth active region is aligned with the lower side of the seventh active region.

9. The method according to claim 7, wherein
the sixth active region has an upper side facing the fifth active region in the first direction,
the eighth active region has an upper side facing the seventh active region in the first direction, and
the upper side of the sixth active region is aligned with the upper side of the eighth active region.

10. The method according to claim 7, wherein
the fifth active region has an upper side facing the second active region in the first direction,
the seventh active region has an upper side facing the fourth active region in the first direction, and
the upper side of the fifth active region is aligned with the upper side of the seventh active region.

11. The method according to claim 6, wherein
the second active region has a lower side facing the fifth active region in the first direction,
the fourth active region has a lower side facing the seventh active region in the first direction, and
the lower side of the second active region is aligned with the lower side of the fourth active region.

12. The method according to claim 11, wherein
the fifth active region has an upper side facing the second active region in the first direction,
the seventh active region has an upper side facing the fourth active region in the first direction, and
the upper side of the fifth active region is aligned with the upper side of the seventh active region.

13. The method according to claim 11, wherein
the sixth active region has an upper side facing the fifth active region in the first direction,
the eighth active region has an upper side facing the seventh active region in the first direction, and
the upper side of the sixth active region is aligned with the upper side of the eighth active region.

14. The method according to claim 1, wherein
an upper side of the first active region is aligned with an upper side of the third active region, and
a lower side of the second active region is aligned with a lower side of the fourth active region.

15. The method according to claim 1, wherein
a first width in the first direction between an upper side of the first active region and a lower side of the second active region is equal to a second width in the first direction between an upper side of the third active region and a lower side of the fourth active region.

16. A method, comprising:
placing a first cell in a first row of a design layout, wherein the first cell comprises a first active region and a second active region, wherein the first active region is separated from the second active region by a first distance in a first direction;
placing a second cell in the first row of the design layout, wherein the second cell comprises a third active region and a fourth active region, wherein the third active region is separated from the fourth active region by a second distance in the first direction, the second distance different from the first distance; and
manufacturing a semiconductor device according to the design layout,
wherein
the first cell further comprises a fifth active region,
the second cell further comprises a sixth active region, along the first direction,
the second active region is between the first active region and the fifth active region,
the fourth active region is between the third active region and the sixth active region,
the first cell includes no active region between the first and second active regions, and no active region between the second and fifth active regions, and
the second cell includes no active region between the third and fourth active regions, and no active region between the fourth and sixth active regions,
the fifth active region is separated from the second active region by a third distance in the first direction, and
the sixth active region is separated from the fourth active region by a fourth distance in the first direction, the fourth distance different from the third distance.

17. The method according to claim 16, wherein
the first active region has an upper side facing away from the second active region in the first direction,
the third active region has an upper side facing away from the fourth active region in the first direction,
the upper side of the first active region is aligned with the upper side of the third active region,
the fifth active region has a lower side facing away from the second active region in the first direction,
the sixth active region has a lower side facing away from the fourth active region in the first direction, and
the lower side of the fifth active region is aligned with the lower side of the sixth active region.

18. The method according to claim 16, wherein
the first active region has a lower side facing the second active region in the first direction,
the third active region has a lower side facing the fourth active region in the first direction,
the lower side of the first active region is aligned with the lower side of the third active region,
the second active region has a lower side facing the fifth active region in the first direction,
the fourth active region has a lower side facing the sixth active region in the first direction, and
the lower side of the second active region is aligned with the lower side of the fourth active region.

19. The method according to claim 16, wherein
the first active region has a lower side facing the second active region in the first direction,
the third active region has a lower side facing the fourth active region in the first direction,
the lower side of the first active region is aligned with the lower side of the third active region,
the fifth active region has an upper side facing the second active region in the first direction,
the sixth active region has an upper side facing the fourth active region in the first direction, and
the upper side of the fifth active region is aligned with the upper side of the sixth active region.

20. A method, comprising:
placing a first cell in a first row of a design layout, wherein the first cell comprises a first active region and a second active region, wherein the first active region is separated from the second active region by a first distance in a first direction;
placing a second cell in the first row of the design layout, wherein the second cell comprises a third active region and a fourth active region, wherein the third active region is separated from the fourth active region by a second distance in the first direction, the second distance different from the first distance; and
manufacturing a semiconductor device according to the design layout,
wherein
along the first direction,
the first cell includes no active region between the first and second active regions, and
the second cell includes no active region between the third and fourth active regions,
the first active region has a lower side facing the second active region in the first direction,
the third active region has a lower side facing the fourth active region in the first direction,
the lower side of the first active region is aligned with the lower side of the third active region,
the second active region has a lower side facing away from the first active region in the first direction,
the fourth active region has a lower side facing away from the third active region in the first direction, and
the lower side of the second active region is aligned with the lower side of the fourth active region.

\* \* \* \* \*